(12) United States Patent
Chuang et al.

(10) Patent No.: US 11,978,669 B2
(45) Date of Patent: May 7, 2024

(54) SEMICONDUCTOR STRUCTURE WITH A LAMINATED LAYER

(71) Applicant: Taiwan Semiconductor Manufacturing Company, Ltd., Hsinchu (TW)

(72) Inventors: Chia-Lin Chuang, Taoyuan (TW); Chia-Hao Chang, Hsinchu (TW); Sheng-Tsung Wang, Hsinchu (TW); Lin-Yu Huang, Hsinchu (TW); Tien-Lu Lin, Hsinchu (TW); Yu-Ming Lin, Hsinchu (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 40 days.

(21) Appl. No.: 17/646,901

(22) Filed: Jan. 4, 2022

(65) Prior Publication Data
US 2022/0181206 A1    Jun. 9, 2022

Related U.S. Application Data

(62) Division of application No. 16/656,384, filed on Oct. 17, 2019, now Pat. No. 11,217,480.

(51) Int. Cl.
*H01L 21/768* (2006.01)
*H01L 23/522* (2006.01)
*H01L 23/528* (2006.01)

(52) U.S. Cl.
CPC .. *H01L 21/76897* (2013.01); *H01L 21/76816* (2013.01); *H01L 23/5226* (2013.01); *H01L 23/5283* (2013.01)

(58) Field of Classification Search
CPC ......... H01L 21/76897; H01L 21/76816; H01L 23/5226; H01L 23/5283; H01L 21/76834
See application file for complete search history.

(56) References Cited

U.S. PATENT DOCUMENTS

| | | | | |
|---|---|---|---|---|
| 2013/0320452 | A1* | 12/2013 | Wann | H01L 21/823828 257/E21.409 |
| 2014/0138779 | A1* | 5/2014 | Xie | H01L 29/66553 257/401 |

(Continued)

OTHER PUBLICATIONS

Sze et al., Physics of Semiconductor Devices, 3rd Edition, 2007 John Wiley & Sons, Inc. Appendix H (Year: 2007).*

(Continued)

*Primary Examiner* — Shih Tsun A Chou
(74) *Attorney, Agent, or Firm* — Finnegan, Henderson, Farabow, Garrett & Dunner, L.L.P.

(57) ABSTRACT

The present disclosure provides a semiconductor structure. The structure includes a semiconductor substrate, a gate stack over a first portion of a top surface of the semiconductor substrate; and a laminated dielectric layer over at least a portion of a top surface of the gate stack. The laminated dielectric layer includes at least a first sublayer and a second sublayer. The first sublayer is formed of a material having a dielectric constant lower than a dielectric constant of a material used to form the second sublayer and the material used to form the second sublayer has an etch selectivity higher than an etch selectivity of the material used to form the first sublayer.

20 Claims, 26 Drawing Sheets

(56) References Cited

U.S. PATENT DOCUMENTS

| | | |
|---|---|---|
| 2016/0020303 A1 | 1/2016 | Jun et al. |
| 2016/0133623 A1* | 5/2016 | Xie .................. H01L 23/528 |
| | | 438/586 |
| 2016/0336178 A1* | 11/2016 | Swaminathan ... C23C 16/45542 |
| 2020/0043718 A1 | 2/2020 | Yi et al. |
| 2020/0152504 A1 | 5/2020 | Frougier et al. |

OTHER PUBLICATIONS

Liu et al., Structure and Dielectric Property of High-k ZrO2 Films Grown by Atomic Layer Deposition Using Tetrakis (Dimethylamido) Zirconium and Ozone, Nanoscale Research Letters (2019) 14:154; published May 7, 2019 (Year: 2019).*

Winterkorn et al., Atomic Layer Deposited Etch Stop Layers for Hydrofluoric Acid, Solid-State Sensors, Actuators and Microsystems Workshop, Hilton Head Island, South Carolina, Jun. 5-9, 2016, pp. 133-136 (Year: 2016).*

Miikkulainen et al., Crystallinity of inorganic films grown by atomic layer deposition: Overview and general trends, Journal of Applied Physics 113, 021301 (2013) (Year:2013).

Song et al., Growth behavior and film properties of titanium dioxide by plasma-enhanced atomic layer deposition with discrete feeding method, AIP Advances 9, 035333, 2019 (Year:2019).

Liu et al., Structure and Dielectric Property of High-k ZrO2 Films Grown by Atomic Layer Deposition Using Tetrakis (Dimethylamido) Zirconium and Ozone, Nanoscale Research Letters (2019) 14:154 (Year:2019).

* cited by examiner

SEMICONDUCTOR STRUCTURE WITH A LAMINATED LAYER

CROSS-REFERENCE TO RELATED PATENT APPLICATIONS

This application is a divisional application of U.S. Non-provisional patent application Ser. No. 16/656,384, titled "SEMICONDUCTOR STRUCTURE WITH A LAMINATED LAYER" and filed on Oct. 17, 2019, which is incorporated herein by reference in its entirety.

BACKGROUND

The semiconductor industry has experienced a rapid growth. Technological advances in semiconductor materials and design of semiconductor devices has resulted in miniaturization of devices. These advances increase the complexity of processing and manufacturing of semiconductor devices.

One problem that can occur during the fabrication of small scale semiconductor devices, such as small scale transistors, is the formation of a contact-to-gate short. A contact-to-gate short is a short circuit that occurs when a contact element is misaligned and comes into electrical contact with a gate electrode. One conventional approach to addressing contact-to-gate shorts is using of a self-aligned contact (SAC). Using SAC typically involves an insulator cap to electrically isolate the SAC from the gate conductor. Under the approach, parasitic capacitance may be formed between the gate conductor and the SAC. Additionally, conventional gate insulator caps used to reduce the parasitic capacitance may have poor etch selectivity to oxide and nitride layers, which are widely used dielectric materials in semiconductor fabrication. In other words, using of these conventional gate caps may introduce fabrication challenges. Therefore, there is a need to improve semiconductor device SAC fabrication processes and structures.

BRIEF DESCRIPTION OF THE DRAWINGS

Aspects of the present disclosure are best understood from the following detailed description when read with the accompanying figures. It is noted that, various features are not drawn to scale. In fact, the dimensions of the various features may be arbitrarily increased or reduced for clarity of discussion or ease of illustration.

DETAILED DESCRIPTION

Figure 1A:
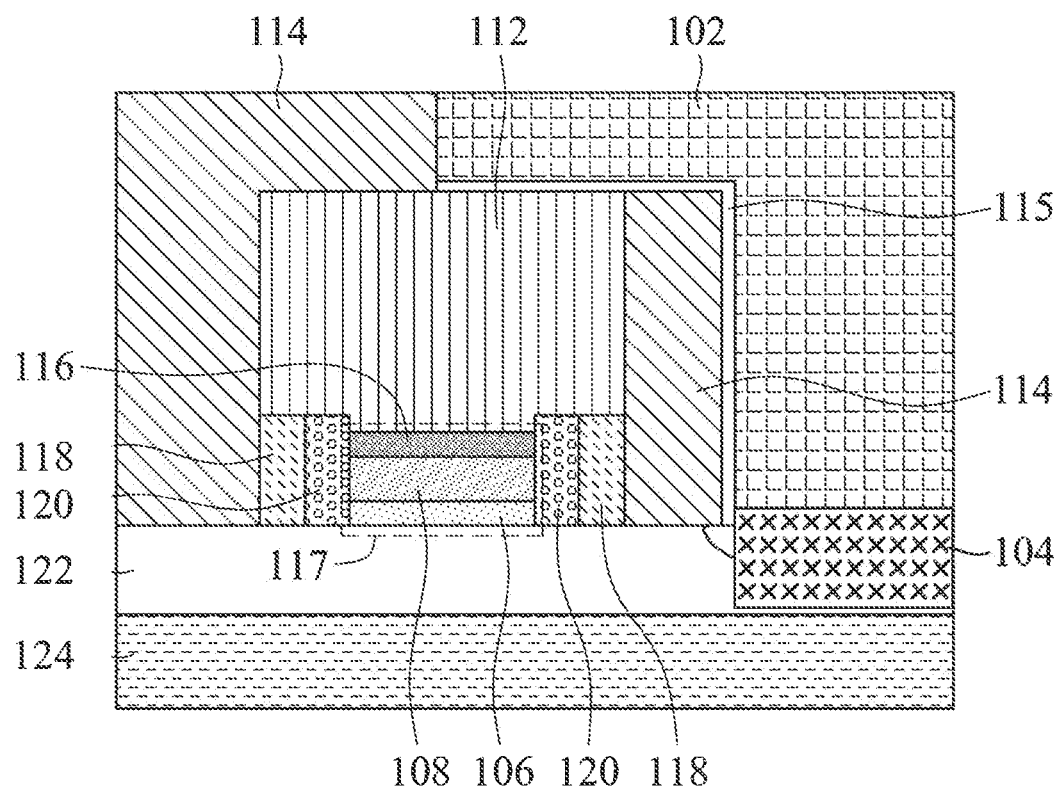
FIG. 1A is a cross-sectional view of semiconductor structure, consistent with various illustrative embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over", "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, unless otherwise noted, the term "in proximity", "close to" "proximate" and the like, when comparing distance between two regions within a semiconductor structure, the semiconductor structure extending laterally and vertically through a characteristic length, width and height, implies that the regions are at most ten percent of either the characteristic length, the characteristic width, or the characteristic height apart. The term "characteristic length" is a largest lengthwise dimension of the semiconductor structure, the term "characteristic width" is the largest widthwise dimension of the semiconductor structure, and the term "characteristic height" is the largest heightwise dimension of the semiconductor structure. The term "in proximity," "close to," "proximate" and the like, when comparing regions within a semiconductor structure may also refer to adjacent regions (e.g., regions in contact with one another, or spaced apart from one another). As used herein, unless otherwise noted, the term "remote," implies that regions are not adjacent to each other.

As used herein, unless otherwise noted, the term "thickness" for a layer that may include variable thickness, implies the smallest thickness of the layer as measured throughout the layer.

As used herein, unless otherwise noted, the term "greater," "higher," "larger," "above" and the like, when comparing two values, the first value being greater than the second value, implies that the first value is at least five percent greater than the second value. Similarly, unless otherwise noted, the term "less," "lower," "smaller" and the like, when comparing two values, the first value being less than the second value, implies that the first value is at least five percent smaller than the second value. As used herein, unless otherwise noted, the term "comparable," "similar" and the like, when comparing two values, implies that one value is in the range of 95 to 105 percent of another value.

Further, as used herein, unless otherwise noted, the term "set" means one or more (i.e., at least one) and the phrase "any solution" means any now known or later developed solution. Furthermore, as used herein, unless otherwise noted, the term "substantially the same," when comparing a first set of values with a second set of values, implies that values in the first set of values are at most 10 percent different from the values in the second set of values. Further, the term "substantially the same," when comparing materials forming regions, implies that materials within regions are the same apart from unintended variations resulted from variation in fabrication techniques used to form the regions. Further, as used herein, unless otherwise noted, the term "substantially" when comparing a first value to a second value implies that the first value is at most 10 percent different from the second value.

Further, as user herein, unless otherwise noted, the term "parallel" when comparing two surfaces implies, that on average, two surfaces are oriented parallel to each other, wherein "on average" implies that first normal directed perpendicular to a first surface, at any point on the surface, and second normal directed perpendicular to a second surface, at any point on the surface, may be collinear with at most 10 degrees of difference from perfect collinearity. As used herein, unless otherwise noted, the term "nonparallel" when comparing two surfaces implies that the surfaces are not parallel as defined above.

Various embodiments generally relate to semiconductor devices, and more particularly to semiconductor devices utilizing gates. For example, the semiconductor device may include a planar device having planar electrodes in parallel planes, made by alternate diffusion of p- and n-type impurities into a substrate. In another example, the semiconductor device may include a FinFET device and may include a plurality of fins formed in a wafer and a gate covering a portion of the fins. The portion of the fins covered by the gate may serve as a channel region of the device. Portions of the fins may also extend out from under the gate and may serve as source and drain regions of the device.

In various embodiments, the semiconductor devices may include structures with gates, source and drain regions, interlayer dielectric layers, self-aligned contacts (SAC), and various insulating layers. For example, FIG. 1A depicts a cross section view of an illustrative semiconductor structure 100, consistent with various embodiments. Structure 100 may include a source/drain region 104, in proximity of a gate stack 117. Gate stack 117 may include a dielectric layer 106, overlying a semiconductor substrate 122. Dielectric layer 106 may include, for example, silicon oxide, silicon nitride, silicon oxynitride, high-k dielectric material, or any suitable combination of those materials. Dielectric layer 106 may include a single layer or, in some embodiments, may include multiple layers of materials. For example, gate dielectric layer 106 may include an interfacial layer (silicon oxide, silicon nitride, silicon oxynitride, etc.) and a high-k material.

Gate stack 117 may include a gate conductive region 108 that may include doped polysilicon, metal, conducting metallic compound, or any suitable combination of materials. Gate conductive region 108 may overlay dielectric layer 106. In some embodiments, gate conductive region 108 may be formed by chemical vapor deposition (CVD), plating, sputtering, physical vapor deposition, etc. Gate conductive region 108 may be doped with elements from group III-A or group V of the Periodic Table of Elements such as boron, phosphorus, and arsenic. The dopants may be introduced during deposition of gate conductive region 108. In some embodiments, gate conductive region 108 may include multiple layers to meet the requirement of device characteristics such as threshold voltage and gate conductance. In various embodiments, gate conductive region 108 may include a polysilicon layer and a metal electrode layer formed atop dielectric layer 106 utilizing a deposition process, such as CVD, plasma-assisted CVD, plating, and/or sputtering, followed by planarization. When a combination of conductive elements is employed, an optional diffusion barrier material such as tantalum nitride, titanium nitride, tungsten nitride may be formed between the conductive materials. Gate stack 117 may include a top conductive layer 116 over the gate conductive region 108. Top conductive layer 116 may be formed from a metallic material, such as tungsten, for example.

Gate stack 117 may be surrounded by spacers 120 and 118 (e.g., silicon oxide, silicon nitride, silicon oxynitride, low-k or high-k dielectric material, or any suitable combination of those materials). In various embodiments, spacer 118 may include a first type dielectric, and spacer 120 may include a second type dielectric. For example, spacer 118 may include silicon nitride, and spacer 120 may include silicon oxynitride. Spacers 120 and 118 may be adjacent to an inter-layer dielectric (ILD) layer 114 (e.g., silicon oxide or silicon nitride) formed upon substrate 122. In various embodiments, spacer 118 may include a contact etch stopping layer, and may be formed, for example, from silicon nitride.

In various embodiments, ILD layer 114 may include an oxide layer deposited over a portion of a surface of the semiconductor substrate. In particular embodiments, ILD layer 114 may be deposited by, e.g., CVD, atomic layer deposition (ALD), plasma-enhanced chemical vapor deposition (PECVD), or other formation techniques. The thickness of ILD layer 114 may be from 10 nanometers (nm) to 500 nm, although lesser and greater thicknesses may be used. In certain embodiments, ILD layer 114 is deposited with a thickness sufficient to cover gate stack 117. ILD layer 114 may be subsequently planarized using chemical-mechanical planarization (CMP). In some embodiments, a liner such as nitride (not shown) may be formed upon a portion of a surface of substrate 122 prior deposition of ILD layer 114.

Semiconductor substrate 122 may include but is not limited to any semiconducting material such as Si-containing materials, Germanium-containing materials, GaAs, InAs and other semiconductors. Si-containing materials include, but are not limited to Si, bulk Si, single crystal Si, polycrystalline Si, SiGe, amorphous Si, silicon-on-insulator substrates (SOI), SiGe-on-insulator (SGOI), annealed poly Si, and poly Si line structures.

In various embodiments, semiconductor substrate 122 may refer to, for example, a top layer of a layered structure. Semiconductor substrate 122 may include Si/SiGe, a silicon-on-insulator (SOI), or a SiGe-on-insulator (SGOI). In some embodiments, when semiconductor substrate 122 is SOI or SGOI substrate, the thickness of the Si-containing layer atop a buried insulating layer 124 can have a thickness on the order of 30 nm or greater. In various embodiments, a plurality of fins (not shown) may be etched from semiconductor substrate 122.

In various embodiments, structure 100 may include a source/drain contact 102. The source/drain contact may include conductive material (e.g., a metal, such as tungsten, titanium, cobalt, ruthenium or a metal-containing material). In various embodiments, the source/drain contact 102 is planarized at the upper surface of ILD layer 114. In some embodiments, source/drain contact 102 may be protected by a liner material 115 such as titanium nitride. In some embodiments, a silicide (not shown) may be formed upon source/drain region 104. In various embodiments, contact 102 may be in proximity to a SAC dielectric layer 112 deposited over gate stack 117 and may be remote from gate stack 117.

In various embodiments, gate stack 117 may be deposited over a first portion of a top surface of semiconductor substrate 122. For example, gate stack 117 is deposited over a middle portion of the top surface of semiconductor substrate 122 as depicted in FIG. 1A. In various embodiments, ILD layer 114 may be deposited over a second portion of semiconductor substrate 122. In various embodiments, SAC dielectric layer 112 may form a laminated dielectric layer deposited over at least a portion of a top surface of gate stack 117. For example, SAC layer 112 may be deposited over a portion of top conductive layer 116. In an illustrative embodiment, SAC layer 112 may be adjacent to top surface of gate stack 117

In various embodiments, SAC dielectric layer 112 may include dielectric sublayers. Some of illustrative materials for dielectric sublayers may include SiO, LaO, AlO, AlN, AlON, ZrO, HfO, SiN, Si, ZnO, ZrN, TiO, TaO, ZrAlO, YO, TaCN, ZrSi, HfSi, SiOCN, SiON, SiOC, and SiCN. The dielectric sublayers may be formed using low-pressure chemical vapor deposition (LPCVD), CVD, ALD, PECVD, or other suitable formation techniques. The thickness of a dielectric sublayer may be 0.1 nm to about 10 nm and may be selected to control compressive and tensile stresses that may develop in SAC layer 112. SAC dielectric layer 112 may contain alternating sublayers adjacent to each other. In various embodiments, SAC dielectric layer 112 may include sublayers of various materials. For example, in an illustrative embodiment, at least one sublayer may include a low-k material, and at least one sublayer may include high etch selectivity material.

The term "low-k" material refers to materials exhibiting relatively small dielectric constants. For example, a low-k material may include silicon oxide, aluminum oxide, silicon nitride, silicon oxynitride, SiOCN, fluorine-doped silicon oxide, carbon-doped silicon oxide, porous silicon oxide, porous carbon-doped silicon oxide, porous aluminum oxide, such as anodized aluminum oxide, and/or the like. In various embodiments, the low-k materials may include materials with dielectric constants lower than 10. For brevity, in the present disclosure, dielectric materials with a dielectric constant higher than 20 may be referred to as "high-k" materials, and materials with a dielectric constant between 10 and 20 may be referred to as "medium-k" materials. Depending on the context of the discussion, and when explicitly specified, materials with a dielectric constant between 3.9 and 20 may be referred to as "medium-k" materials and materials with dielectric constant between 1 and 3.9 may be referred to as "low-k" materials.

The term "etch selectivity" is a comparison of etch rates between two or more materials relative to a particular etchant. This comparison may be expressed in terms of one or more ratios. For example, the term "etch selectivity" for a material, in general, may be defined relative to other materials for a specific etch recipe/technique. As an illustrative example, zirconium oxide may exhibit a high etch selectivity relative to silicon oxide, for an etch recipe that includes a wet chemical etching using hydrofluoric acid. One convenient measure of etch selectivity for a first material relative to a second material is a ratio of an etch rate of the first material, and the etch rate of the second material for a specific etch recipe. For example, the ratio of the etch rate of zirconium oxide, and the etch rate of silicon oxide for a wet chemical etching using hydrofluoric acid may range between 0.01 and 0.001, indicating the high etch selectivity of zirconium oxide relative to silicon oxide for the wet etching using hydrofluoric acid. In various embodiments, many factors may influence the etch rate—the etch recipe (e.g., concentration of hydrofluoric acid for wet chemical etching), annealing of dielectric layers and/or deposition method for the dielectric layers. In some embodiments, the etch rate may be influenced by defects present in the dielectric layers, and doping of the dielectric layers.

Figure 1B:
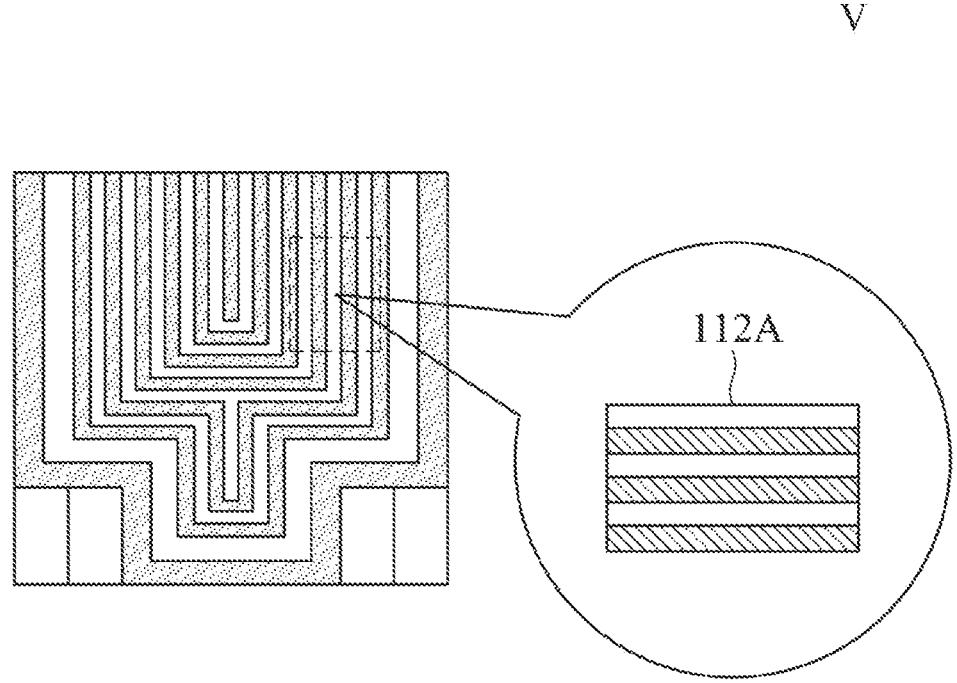
FIG. 1B is a cross-sectional view of a laminated dielectric layer, consistent with various illustrative embodiments.

An illustrative embodiment of SAC dielectric layer 112 is shown in FIG. 1B. SAC dielectric layer 112 contains a region 112A that includes multiple sublayers. It is understood, that region 112A is only illustrative, and any other portion of SAC dielectric layer 112, containing parallel sublayers, may be selected for illustrating the composite structure of layer 112. When fabricating SAC dielectric layer 112, both a dielectric constant and an etch selectivity of layer 112 may be the parameters that can influence the design and fabrication of structure 100. In various embodiments, the dielectric constant of layer 112 may affect a gate to source/drain parasitic capacitance of devices fabricated using layer 112. In various embodiments, forming SAC layer 112 from low-k materials may result in a decrease in the gate to source/drain parasitic capacitance when compared to layer 112 formed from high-k materials. In order to provide layer 112 with desired effective dielectric constant and etch selectivity, SAC dielectric layer 112 may be fabricated as a laminate dielectric layer formed from sublayers, with at least some sublayers formed from low-k materials and at least some sublayers formed from high etch selectivity materials.

Figure 2A:
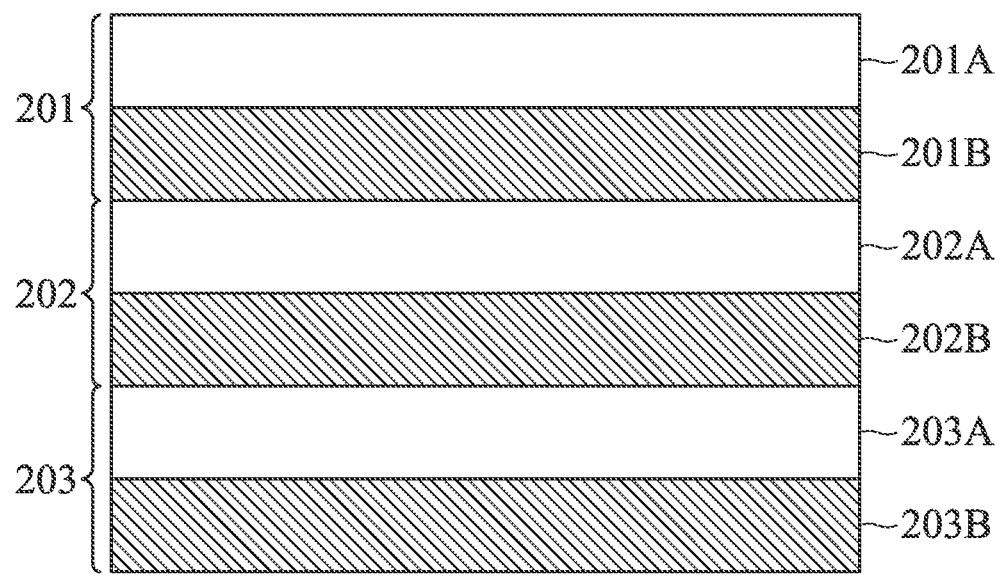
FIGS. 2A through 5 are cross-sectional views of a region of a laminated dielectric layer, consistent with various illustrative embodiments.

FIG. 2A shows region 112A that may include groups 201-203 of sublayers 201A-203A and 201B-203B. Group 201 of sublayers 201A and 201B may be adjacent to group 202 of sublayers 202A and 202B, which in turn, may be adjacent to group 203 of sublayers 203A and 203B. Within each group 201-203, a sublayer labeled "A" may be referred to as the first sublayer, and a sublayer labeled "B" may be referred to as the second sublayer. For example, sublayer 201A, 202A, or 203A may be referred to as the first sublayer and sublayer 201B, 202B, or 203B may be referred to as the second sublayer. In various embodiments, sublayers may be grouped in different configurations, particularly for sublayers not forming a periodic structure. In certain embodiments, sublayers may be defined as regions of substantially the same material having substantially the same morphology.

Each group may include two or more sublayers. For example, group 201 includes two sublayer 201A and 201B formed from different materials.

In an illustrative embodiment, a first sublayer within a group (e.g., sublayer 201A depicted in FIG. 2A) may be formed of a low-k material (e.g., aluminum oxide, silicon oxide, silicon nitride, SiCN, SiOC, SiOCN and/or alloys of those or similar materials). The first sublayer may have thickness of about 0.1 nm to about 10 nm and may be deposited using various suitable formation techniques such as for example, ALD or CVD.

In an illustrative embodiment, a second sublayer within a group (e.g., sublayer 201B) may be formed from a material that has a lower etch rate relative to the etch rate of adjacent ILD layer 114, resulting in high etch selectivity of the second sublayer. For example, an etch recipe for etching ILD layer 114 may include wet or dry etching. In some cases, ILD layer 114 may be etched using BOE technique. In various embodiments, the second sublayer may have thickness of about 0.1 nm to about 10 nm.

In various embodiments, the second sublayer (e.g., sublayer 201B) may be formed from a material that may have higher dielectric constant than the dielectric constant of the first sublayer (e.g., sublayer 201A). In some embodiments, the second sublayer may be formed from a material with etch selectivity higher than the etch selectivity of the material of the first sublayer. In some embodiments, the second sublayer may be formed from a medium-k or a high-k material. In some embodiments, the second sublayer material may include zirconium oxide, hafnium oxide, $LA_2O_3$, $HfSiO_4$, $Y_2O_3$, $LaAlO_3$, $TaO_2$, or $Ta_2O_5$, and/or the like. In some embodiments, the thickness of the first sublayer may be similar to the thickness of the second sublayer.

In various embodiments, it may not be possible to find a dielectric material that has both a low dielectric constant and a high etch selectivity. To satisfy requirement of low dielectric constant for the first sublayer, the first sublayer may be formed from a material that has a relatively low etch selectivity. For example, the first sublayer may be formed of a material that has a similar etch rate or a higher etch rate relative to the etch rate of the material of proximate ILD layer 114. In some embodiments, the first sublayer may have an etch rate that is lower than the etch rate of proximate ILD layer 114, but higher than the etch rate of the second sublayer. In various embodiments, the material for the first sublayer is selected to reduce the effective dielectric constant of region 112A while maintaining acceptable etch selectivity for region 112A. In an example embodiment, an etch ratio between the etch rate of the first sublayer and the etch rate of the second sublayer may range between 1 and 0.1, and in some cases may be more than 10.

Figure 2B:
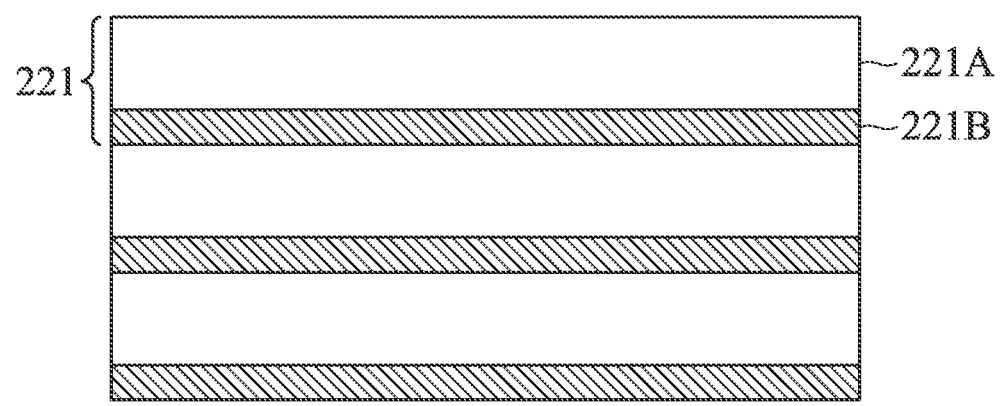

In various embodiments, sublayers within groups of sublayers may have different thicknesses. For example, FIG. 2B shows, a group 221 with a sublayer 221A having a first thickness and a sublayer 221B having a second thickness, that may be smaller than the first thickness of sublayer 221A. Sublayers depicted in FIG. 2B are only illustrative, and other thicknesses of sublayers may be chosen. In an example embodiment, sublayer 221A may be thinner than sublayer 221B. In some embodiments, the ratio of the thickness of sublayer 221A to the thickness of sublayer 221B may range between 0.1 and 10. The ratio of thicknesses of sublayers may be selected based on effective dielectric constant and etch selectivity desired for region 112A and may be one of the key parameters that can be used to selectively control the properties of region 112A.

In an illustrative embodiment, sublayer 221A may be formed from low-k material. Sublayer 221B may be formed from material with etch selectivity higher than the etch selectivity of the material of sublayer 221A. In some embodiments, sublayer 221B may be formed from medium-k or high-k material that has lower etch rate relative to the etch rate of adjacent ILD layer 114. In various embodiments, low-k sublayer 221A may be adjacent to top conductive layer 116, followed by medium-k or high-k sublayer 221B. Alternatively, sublayer 221B may be adjacent to top conductive layer 116 followed by sublayer 221A.

Figure 2C:
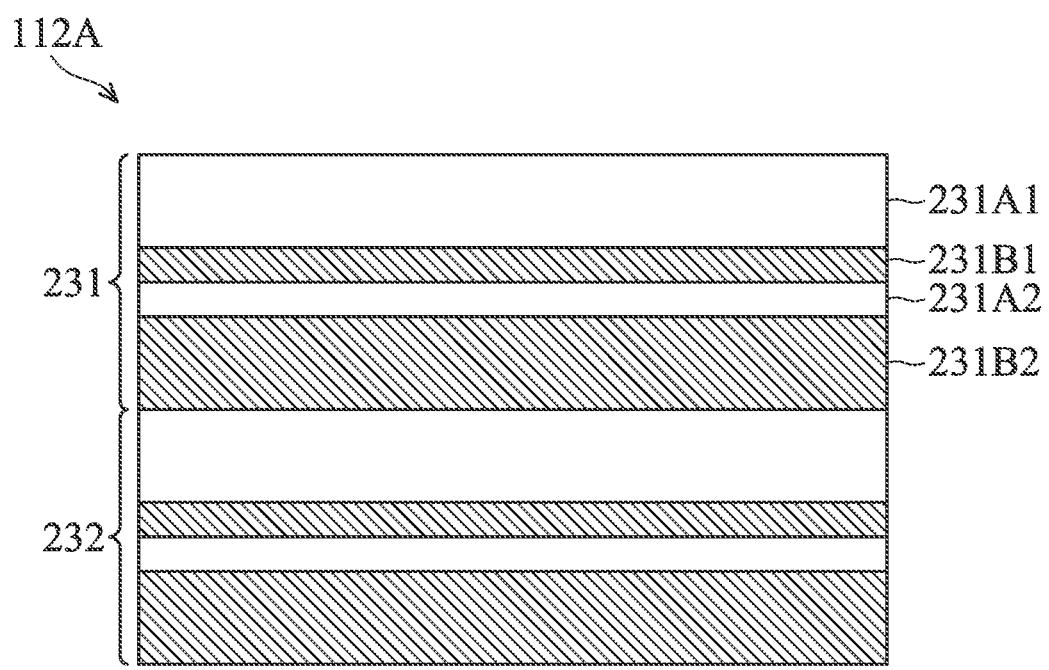

In various embodiments, groups of sublayers may have more than two sublayers. For example, FIG. 2C shows an illustrative embodiment comprising groups 231 and 232, with each group having four sublayers of different thicknesses. In an example embodiment, sublayers 231 A1 and 231 A2 may be formed from a first dielectric material, while sublayers 231 B1 and 231 B2 may be formed from a second dielectric material. For example, sublayers 231 A1 and 231 A2 may be formed from a low-k material, while sublayers 231 B1 and 231 B2 may be formed from a material with etch selectivity higher than the etch selectivity of the material of sublayer 231 A1 or sublayer 231 A2. In an illustrative embodiment, sublayers 231 B1 and 231 B2 may be formed from medium-k or high-k materials. Sublayers in the groups 231 and 232 may have different thicknesses. In an illustrative embodiment, sublayer 231 A1 and 231 A2 may be thicker than sublayers 231 B1 and 231 B2.

In various embodiments, some sublayers may include alloys of various dielectric materials. For example, a sublayer may include an alloy of zirconium oxide and aluminum oxide or the alloy of zirconium oxide and silicon oxide. Examples of the alloys are only illustrative, and various other dielectric alloys may be used as well. The composition of an alloy may be selected to result in a low-k material with an improved etch selectivity. In various embodiments, sublayers containing alloys of various materials may have non-uniform or graded composition. In various embodiments, sublayers formed from alloyed materials may be combined with various other sublayers to form SAC layer 112.

Figure 3:
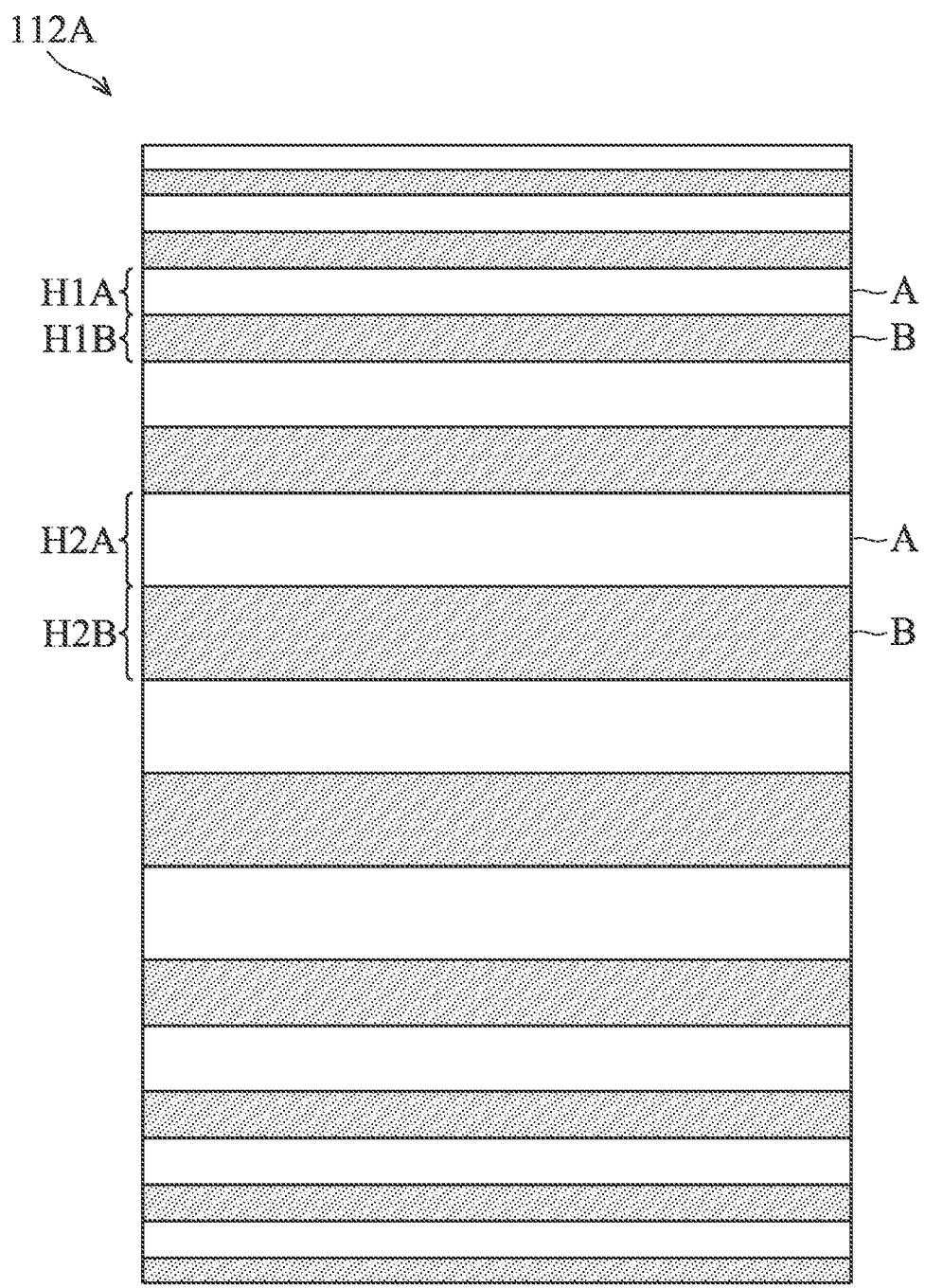

In various embodiments, a sublayer thickness may gradually change throughout region 112A of SAC dielectric layer 112. For example, FIG. 3 shows an illustrative embodiment of several sublayers A and B with corresponding thickness H1A, H1B, H2A, and H2B. In an illustrative embodiment depicted in FIG. 3, thicknesses of sublayers A and B increase towards the middle of the region 112A. The gradual variation of thicknesses of sublayers A and B may be beneficial for controlling dielectric constant of layer 112 while also controlling stresses within layer 112.

Various embodiments of sublayers shown in FIGS. 2A-2C and FIG. 3 are only illustrative of some configurations of sublayers forming region 112A of SAC dielectric layer 112. To this extent, the number of sublayers within layer 112, the thickness of sublayers, the material of sublayers and the order of sublayers may be varied and/or modified.

Figure 4A:
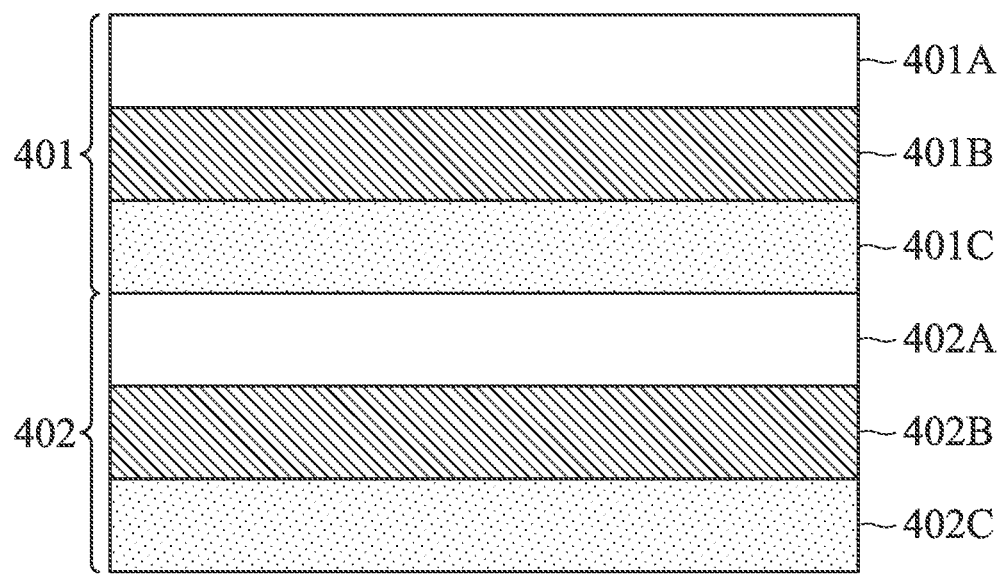

In various embodiments, more than two different materials may be used to form sublayers. In some embodiments, SAC layer 112 may include a plurality of alternating groups of sublayers, with an illustrative group of sublayers including the first sublayer followed by the second sublayer, and followed by the third sublayer. For example, FIG. 4A shows groups 401 and 402 of respective sublayers 401A-401C and 402A-402C, where sublayer 401A may be formed from a first material, such as, for example, a low-k material, sublayer 401B may be formed from a second material, such as, for example, a medium-k material, and sublayer 401C may be formed from a third material such as, for example, a high-k material. In some embodiments, low-k materials may include silicon oxide, silicon nitride, SiCN, SiOC, SiOCN and/or alloys of those or similar materials, medium-k materials may include aluminum oxide, $Y_2O_3$, $HfSiO_4$ or the like, and high-k materials may include $HfO_2$, $La_2O_3$, $Ta_2O_3$, $ZrO_2$, or the like.

Additionally, or alternatively, the third material may have etch selectivity higher than the etch selectivity of the first or the second material (i.e., highest etch selectivity). In an illustrative embodiment, the second material (material of sublayer 401B) may have etch selectivity higher than the etch selectivity of the first material (material of sublayer 401A). In an example embodiment, the second material may have etch selectivity lower than the etch selectivity of the third material (material of sublayer 401C). In various embodiments, sublayers 401A-401C depicted in FIG. 4A may be formed from either of the first, the second or the third material, with the material of sublayer 401A different from the material of sublayer 401B, and with the material of sublayer 401C different from material of the sublayers 401A and 401B. In various embodiments, materials with low etch selectivities (e.g., material of sublayer 401A) may include silicon oxide, SiCN, SiOC, SiOCN and/or alloys of those or similar materials. Materials with higher etch selectivities (e.g., material of sublayer 401C) may include $HfO_2$, $ZrO_2$ or the like, and the material with an intermediate etch selectivity may include silicon nitride, $HfSiO_4$ or the like. The choice of materials for sublayers 401A-401C described above is only illustrative. In an example embodiment, sublayer 401A may be formed from a material with the highest etch selectivity. The specific choice of the materials and the arrangement of sublayers may be predicated on device fabrication and device design requirements. In various cases, layers formed from materials with low etch selectivity may be sandwiched between layers formed from materials with higher etch selectivities to prevent exposing layers formed from materials with lower etch selectivities to etching agents.

Figure 4B:
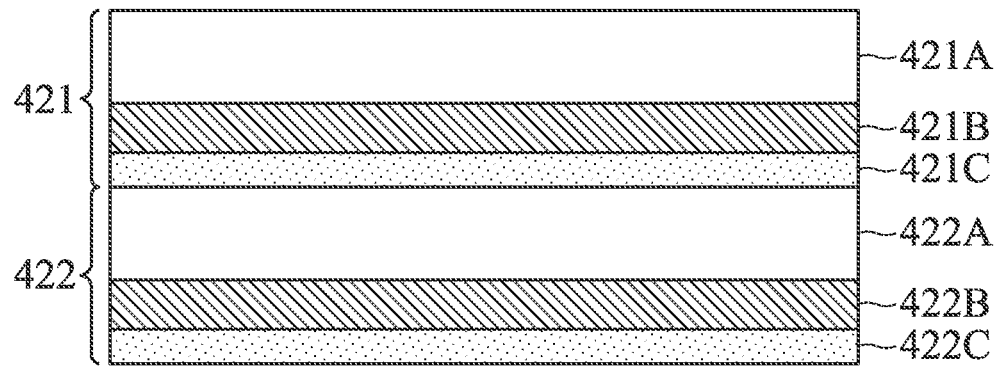

FIG. 4B shows an illustrative embodiment of sublayers 421A through 422C that include various thicknesses. The sublayers may be organized into groups. For example, sublayers 421A-421C may belong to a group 421, and sublayers 422A-422C may belong to a group 422 as shown in FIG. 4B. For example, a sublayer 421B and a sublayer 421C may have smaller thicknesses than a sublayer 421A. In an illustrative embodiment, sublayer 421C may be formed from a material with etch selectivity higher than the etch selectivity of a material for sublayer 421A and sublayer 421B. In an illustrative embodiment, sublayer 421A may be formed from a material with a dielectric constant lower than the dielectric constant of materials forming sublayers 421B and 421C. In some embodiments, the thicknesses of sublayers 421A through 422C may range from 0.1 nm to 10 nm. Sublayers depicted in FIG. 4B are only illustrative, and other thicknesses of sublayers may be chosen. In an example embodiment, sublayer 421A may be thinner than sublayer 421B. In some embodiments, the ratio of the thickness of sublayer 421A to the thickness of sublayer 421B or 421C may range between 0.1 and 10. The choice of materials and thicknesses for sublayers 421A through 422C may depend on desired effective dielectric constant and etch selectivity for region 112A.

Figure 4C:
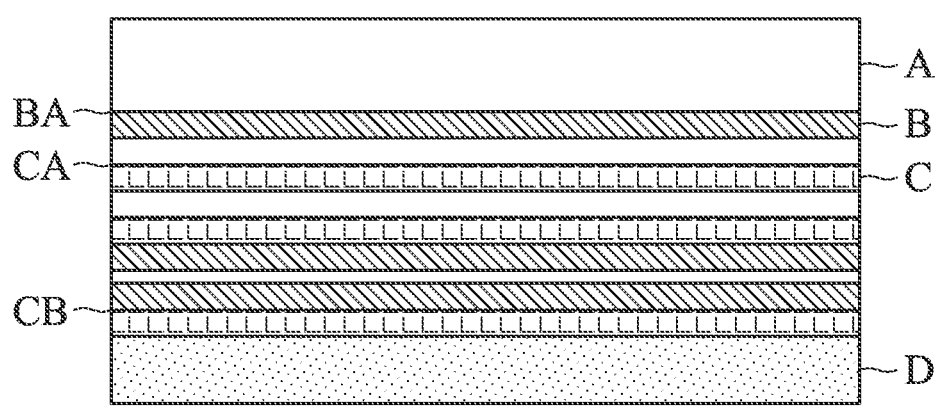

FIG. 4C shows that sublayers forming region 112A may include various thicknesses and may be arranged in a variety of ways. Referring to FIG. 4C, the like components are identified by the same corresponding label A-D. In FIG. 4C, unlabeled sublayers correspond to the like labeled sublayers that have the same fill pattern. In various embodiments, sublayers A may have various thicknesses throughout region 112A shown in FIG. 4C, and may be deposited over sublayers B forming BA interface. Alternatively, as shown in FIG. 4C, sublayers A may be deposited over sublayers C forming a CA interface. Various other combinations are possible. For example, sublayers B may be deposited over sublayers C forming a CB interface. In various embodiments, sublayers A-D may be formed from either of a first, a second a third or a fourth material, with the first material being different from the second material, the third material being different from the first or the second material, and the fourth material being different from any other material. In an illustrative embodiment, sublayer A is formed from a material that is different from a material of sublayer B, sublayer C is formed from a material that is different from the material of sublayers A and B, and sublayer D may be formed from a material that is different from the material of any other sublayers.

In an illustrative embodiment, shown in FIG. 4C, sublayer A may be formed from a low-k material, sublayer B may be formed from a medium-k material, sublayer C may be formed from a high-k material, and sublayer D may be formed from a low-k material that is different from the low-k material of sublayer A. For example, sublayer D may be formed from silicon oxide, and sublayer A may be formed from aluminum oxide. In an illustrative embodiment, sublayer B may be formed from silicon nitride and sublayer C may be formed from zirconium oxide, hafnium oxide or the like. In an illustrative embodiment, sublayer A may be formed from a material with an etch selectivity that is lower than the etch selectivity of materials forming sublayer B or sublayer C. In an illustrative embodiment, sublayer B may be formed from a material with an etch selectivity that is lower than the etch selectivity of materials forming sublayer C or sublayer D. In an illustrative embodiment, sublayer A may be formed from silicon oxide, sublayer B may be formed from aluminum oxide, sublayer C may be formed from zirconium oxide, and sublayer D may be formed from silicon nitride.

Various embodiments of sublayers shown in FIG. 4C are only illustrative of various sublayers forming region 112A of SAC dielectric layer 112. To this extent, the number of sublayers within layer 112, the thickness of sublayers, the material of sublayers and the order of sublayers may be modified. The choice of materials and thicknesses of sublayers A-D allows for fabricating region 112A with desired effective dielectric constant and etch selectivity properties. The specific selection of the materials and the thicknesses of sublayers A-D may be predicated on a device fabrication and device design requirements.

Figure 5:
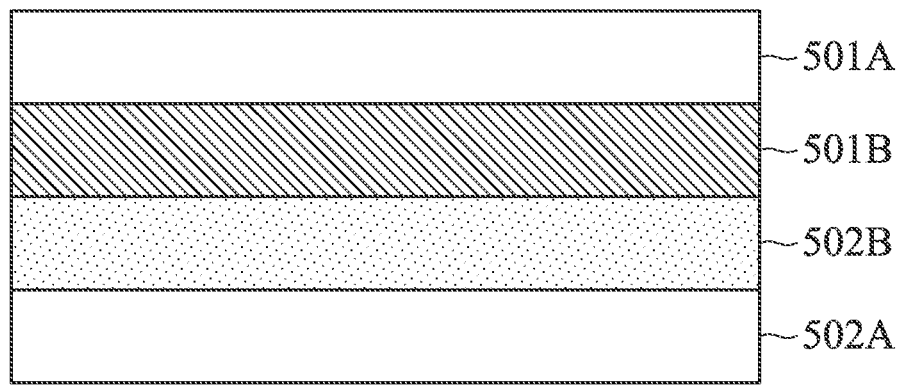

FIG. 5 shows an illustrative embodiment of region 112A of SAC dielectric layer 112, with sublayers 501A and 502A formed form a first material, and sublayers 501B and 502B formed from a second material. In an example embodiment, sublayer 502B may be deposited over sublayer 501A. In an illustrative embodiment, sublayer 502B may be deposited using various suitable formation techniques such as ALD, CVD, or MOCVD. In an example embodiment, sublayer 502B may be formed from aluminum oxide and deposited using ALD. Sublayer 501B may be deposited use a different deposition technique than the technique(s) used for deposition of sublayer 502B. For example, sublayer 501B may be deposited using ALD at a different temperature than the temperature used for deposition of sublayer 502B. Alternatively, sublayer 502B may be deposited using CVD, while sublayer 501B may be deposited using ALD. As a result, sublayer 501B may be formed from the same material (e.g., aluminum oxide) as sublayer 502B but with different morphology. The term "morphology" refers to material structure (i.e., presence of dislocations, point defects, impurities, cracks, shape, and size of nanostructures, material compositional variation and similar metrics). In an example embodiment, sublayer 501B may contain dislocation density and/or point defect density that is lower than dislocation density and/or point defect density of sublayer 502B. In some embodiments, sublayer 501B may experience tensile or compressive stresses due to presence of adjacent layers. The stresses and dislocations presented in the sublayers may affect the etch rate of the sublayers. In various embodiments, the layer deposition may be selected to reduce the etch rate of SAC dielectric layer 112.

Figure 6A:
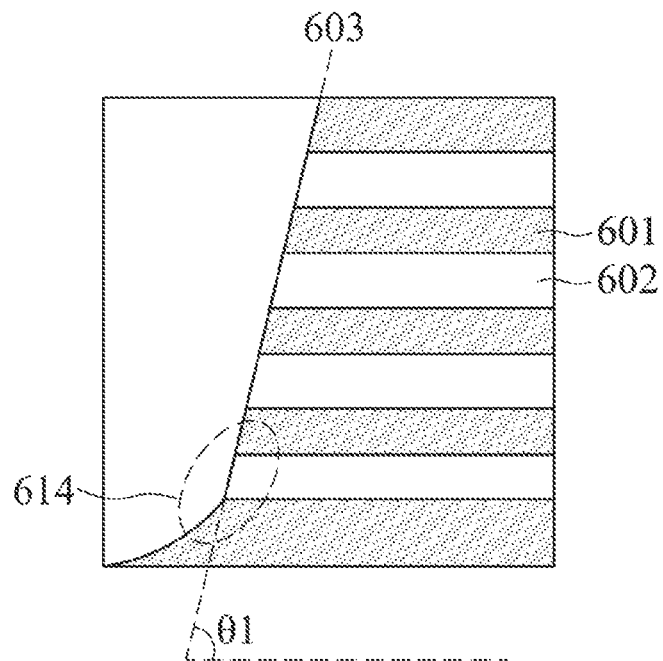
FIGS. 6A and 6B are cross-sectional views of a region of a laminated dielectric layer, consistent with various illustrative embodiments.
Figure 6B:
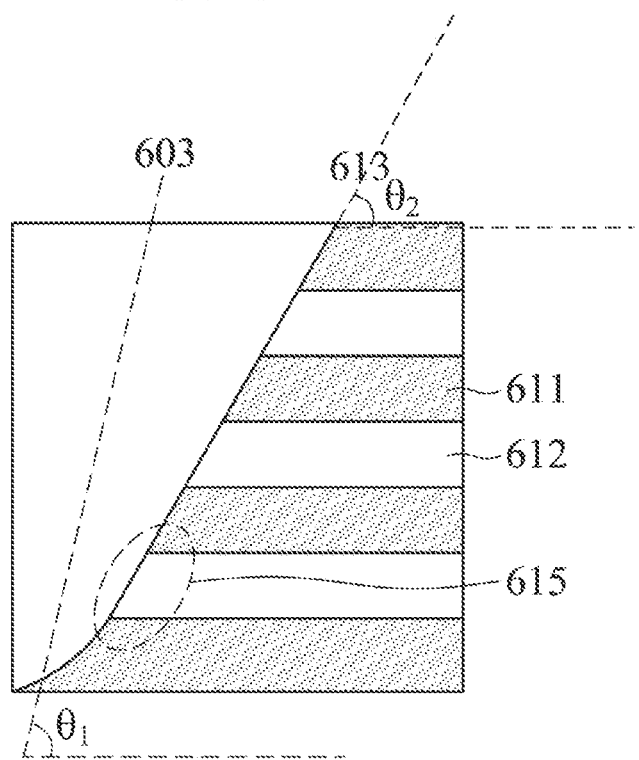

FIGS. 6A and 6B show TEM images of an illustrative portion of SAC layer 112 after etching. The portion of SAC layer 112, shown in FIG. 6A has alternating sublayers 601 and 602, with sublayer 601 formed from a material with an etch selectivity higher than the etch selectivity of a material of sublayer 602. The thickness of sublayers 601 and 602, the materials forming these sublayers, and arrangement of these sublayers may affect the overall etch selectivity of SAC layer 112. For example, FIGS. 6A and 6B show that when sublayers 601 and 602 are etched laterally, the thickness of the sublayers may affect the etch selectivity of SAC layer 112. When the thickness of sublayers is sufficiently small (e.g., 0.1 to 3 nanometers), a sublayer formed from a material with higher etch selectivity may protect a sublayer formed from a material with lower etch selectivity. For example, sublayer 602 with relatively low etch selectivity is not significantly etched. The degree of etching may be inferred from an inclination angle $\theta=\theta_1$ (also indicated by line 603), resulting from etching the portion of SAC layer 112 in FIG. 6A. FIG. 6B shows sublayers 611 and 612 with a larger thickness (thickness of sublayers may be larger than 3 nm). Sublayer 611 is formed from a material with an etch selectivity higher than the etch selectivity of the material of sublayer 612. The portion of SAC layer 112 shown in FIG. 6B is etched more than a similar portion of SAC layer 112 shown in FIG. 6A, as can be inferred from inclination angle $\theta=\theta_2$ (also indicated by line 613), that is smaller than the inclination angle $\theta_1$ (also indicated by line 603). Sublayer 612 with relatively low etch selectivity is significantly etched. By selecting sublayers 611 and 612 with smaller thickness (for example, smaller than 3 nm), the etchant chemical agent may not be able to penetrate laterally the sublayers and result in significant etching. For example, in FIG. 6A, sublayer 602 is not significantly etched, as shown by a region 614, as compared, with sublayer 612, shown by a region 615 in FIG. 6B. Sublayer 612 of FIG. 6B having a greater thickness than corresponding sublayer 602 of FIG. 6A is etched considerably, as shown for example, by difference between angles $\theta_1$ and $\theta_2$ that can be few tens of degrees.

Figure 7A:
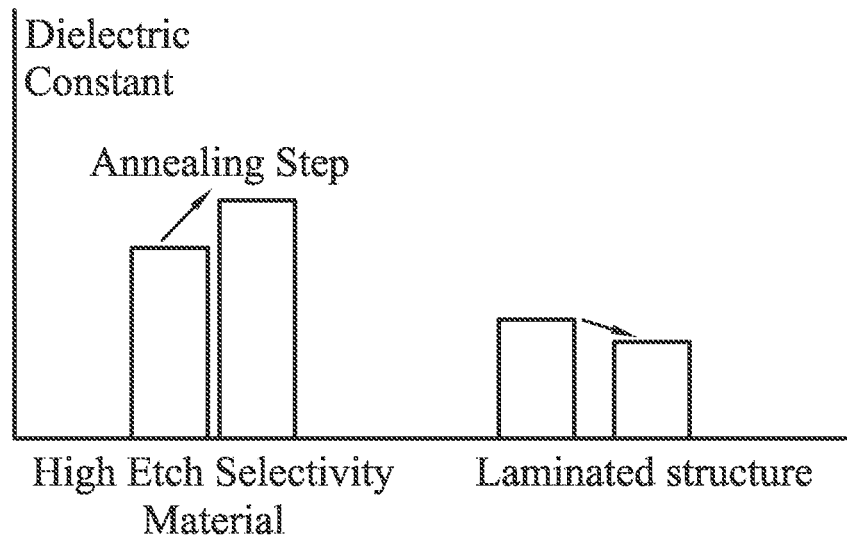
FIGS. 7A and 7B illustrate effect of annealing of dielectric layers on dielectric constant and etch selectivity of these layers, consistent with various illustrative embodiments.

Annealing of dielectric layers (e.g., SAC layer 112) may affect both a dielectric constant and an etch selectivity of the layers. The annealing process, may include, for example, heating dielectric layers at temperatures between 300-800° C. for a selected interval of time. For example, heating may proceed for 0.1 to 0.8 seconds, between 0.8 and 2 seconds, or in some cases for more than 2 seconds. During the annealing process, a dielectric constant of the high etch selectivity material may increase. The increase may be as much as twenty percent as observed for some high etch selectivity materials (e.g., zirconium oxide). For example, FIG. 7A represents qualitative changes in a dielectric constant due to annealing of a dielectric layer formed from a high etch selectivity material as well as qualitative changes in a dielectric constant of a dielectric laminate structure. In an illustrative embodiment shown in FIG. 7A, the high etch selectivity material includes zirconium oxide. FIG. 7A, shows, for example, that annealing of the dielectric layer formed from the high etch selectivity material may increase the dielectric constant of the dielectric layer, while annealing of the laminated structure may slightly decrease the effective dielectric constant of the laminated structure. The laminate structure may include thin layers (e.g., layers with thickness in the range of 0.1 to 3 nanometers) that may not fully crystallize due to annealing, thus resulting in relatively small changes (e.g., less than 10%) in dielectric constant due to annealing. The dielectric constant of various layers, including the effective dielectric constant of the laminate structure, may be measured by suitable methods, such as with a mercury probe.

Figure 7B:
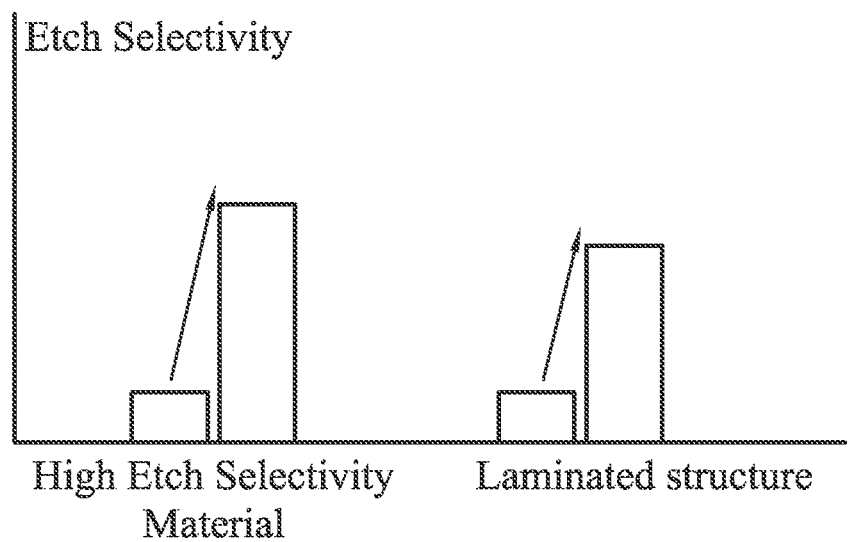

FIG. 7B shows qualitative effect of annealing on etching selectivity. In general, annealing may improve etching selectivity by decreasing the number of defects presented in dielectric materials. Annealing may increase etch selectivity for bulk materials and for laminated structures formed from dielectric sublayers as indicated in FIG. 7B. The amount of increase in etch selectivity depends on many factors such as dislocation density of the initially deposited layers, the duration of annealing and the annealing temperature. For example, after annealing the etch selectivity may increase by an order of magnitude for various dielectric layers including layers formed from bulk high etch selectivity material of laminated structures.

In various embodiments, SAC dielectric layer 112 may include an irregular shape when deposited in a trench formed by etching various layers of structure 100. The shape of layer 112 affects the effective dielectric constant and etch selectivity of layer 112. For example, layer 112 may have anisotropic effective dielectric constant dependent on position and arrangement of sublayers forming layer 112. The position and arrangement of sublayers may depend on the shape of layer 112. Furthermore, arrangement of sublayers may influence the overall etch selectivity of layer 112. For example, positioning sublayers with high etch selectivity at the outer sides of layer 112 may improve etch selectivity of layer 112 as compared to similar layers without such sublayers positioned at the outer sides.

Figure 8A:
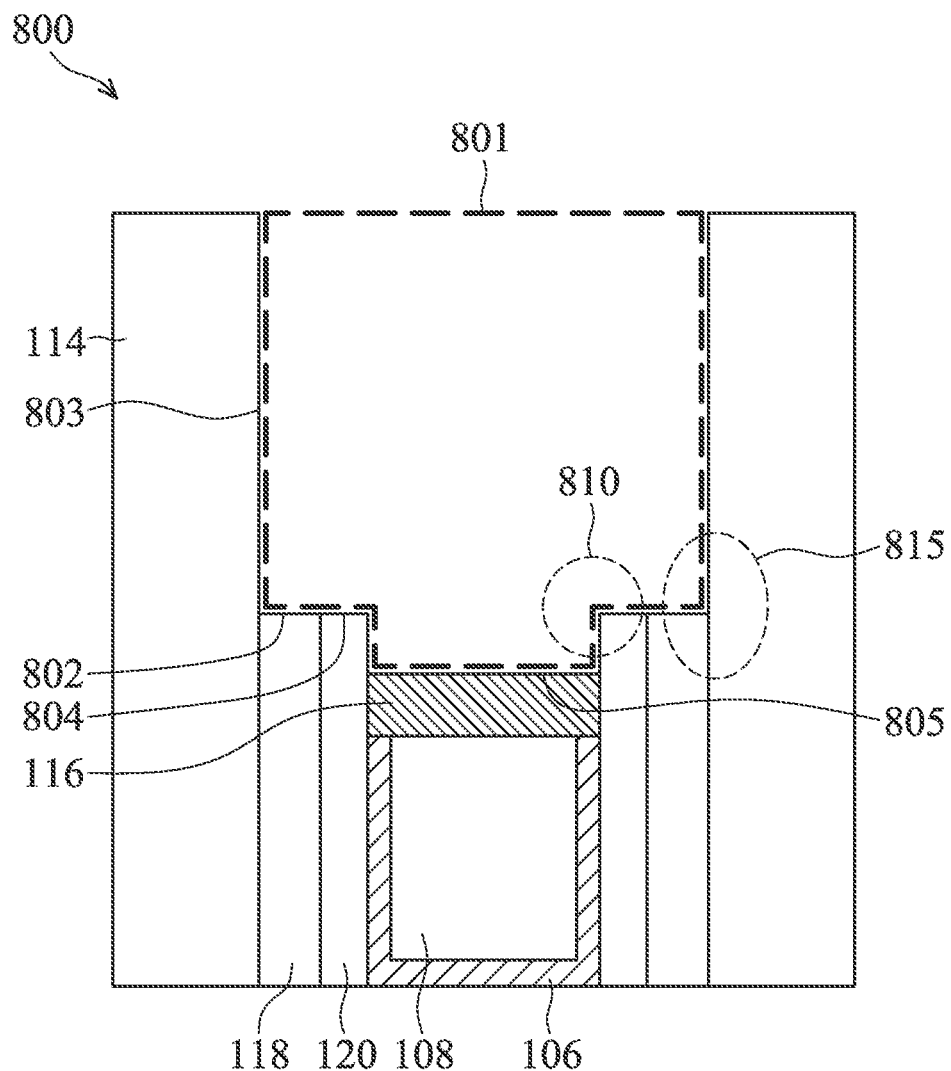
FIGS. 8A through 13 are cross-sectional views of the laminated dielectric layer, consistent with various illustrative embodiments.

FIG. 8A shows an illustrative structure 800 before deposition of SAC dielectric layer 112. Various aspects of structure 800 describe the embodiments of a SAC trench 801 which may determine possible configurations of SAC dielectric layer 112. Structure 800 may include dielectric layer 106, gate conductive region 108, spacer 120, spacer 118, ILD layer 114 and top conductive layer 116. Layer 114, and spacers 118 and 120 may be etched to provide SAC trench 801 for deposition of SAC dielectric layer 112. SAC trench 801, as shown in FIG. 8A may contain corners 815 and 810. In various embodiments, surfaces adjacent to SAC trench 801 may include surfaces of ILD layer 114, spacer 118, spacer 120, and layer 116. In various embodiments, a surface 803 of ILD layer 114 may not be parallel to a surface 805 of layer 116 or to the top surface of semiconductor substrate 122. In some embodiments, surfaces 802 and 804 respectively of spacer 120 and spacer 118 may be parallel to surface 805 of layer 116. Some surfaces of spacer 120 and spacer 118 may not be parallel to surface 805 of layer 116. In various embodiments, shape of SAC trench 801, shown in FIG. 8A is referred to as T shape.

Figure 8B:
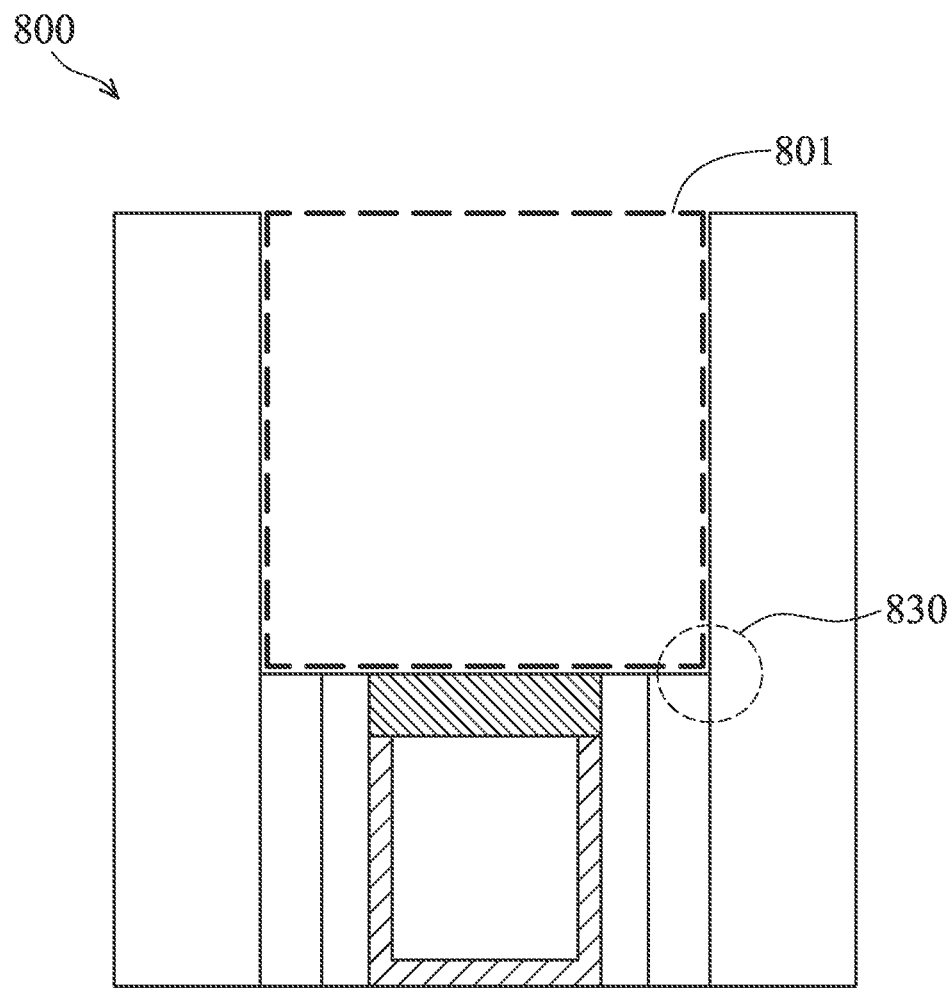
Figure 8C:
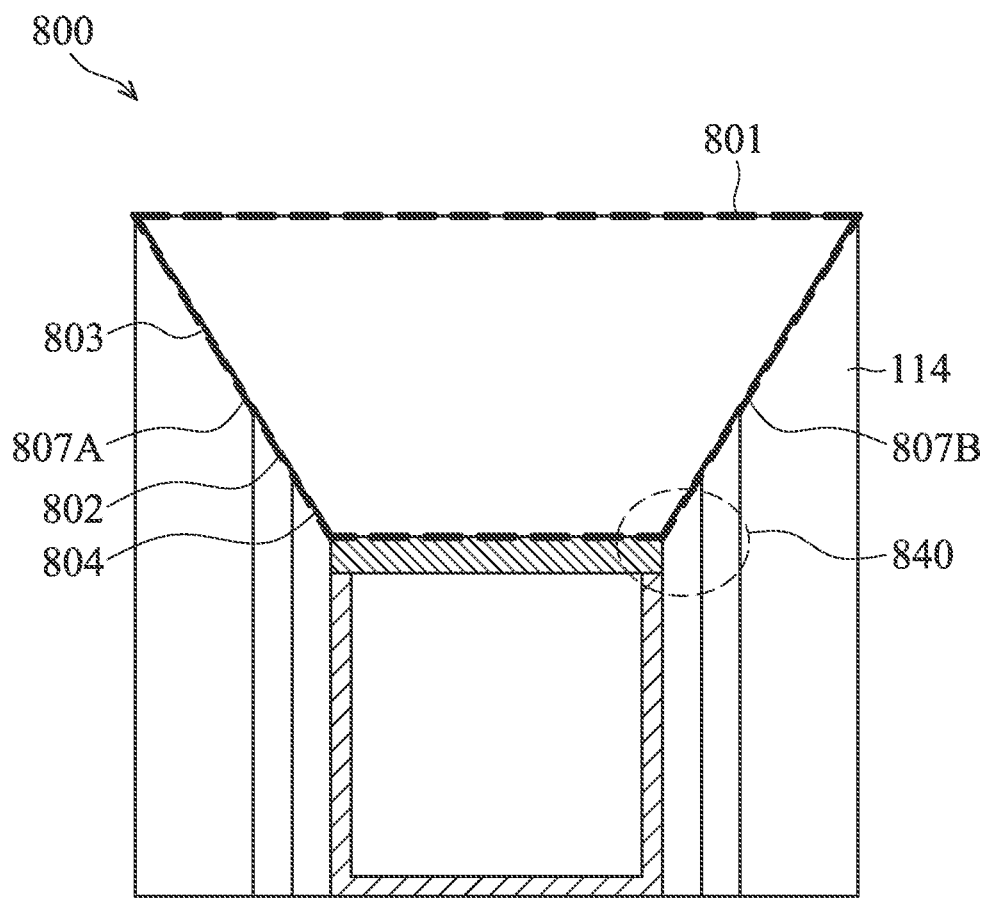

FIG. 8B shows another illustrative structure, with SAC trench 801 containing a corner 830. In various embodiments, shape of SAC trench 801, shown in FIG. 8B is referred to as square shape. FIG. 8C shows another illustrative embodiment of a possible structure containing SAC trench 801 with slanted sides formed by surfaces 807A and 807B. SAC trench 801 may contain a corner 840. Surface 807A may include surface 803 of ILD layer 114, as well as surfaces 802 and 804. The shape of SAC trench 801 shown in FIG. 8C is referred to as trapezoidal shape.

FIGS. 9-12 show various embodiments of SAC dielectric layer 112 deposited into T shape SAC trench 801 and extending in gate parallel and gate perpendicular directions. Various embodiments illustrated in FIG. 9-12 describe various configurations of layer 112 that can be used for fabrication of structure 100. The embodiments described below, demonstrate the various ways in which layer 112 may be fabricated to fulfill device design and device fabrication requirements, such as, requirements of low effective dielectric constant and high etch selectivity for layer 112. In some embodiments, depicted, for example in FIG. 9, SAC layer 112 may be adjacent to at least a portion of the surface of ILD layer 114 that may be nonparallel to the top surface of the semiconductor substrate. For example, SAC layer 112 may be adjacent to surface 803, depicted in FIG. 9 that may be nonparallel to the top surface of the semiconductor substrate. In various embodiments, the shape, and position of SAC layer 112 may determine orientation and position of dielectric sublayers A and B, that may affect anisotropic effective dielectric constant of layer 112.

Figure 9:
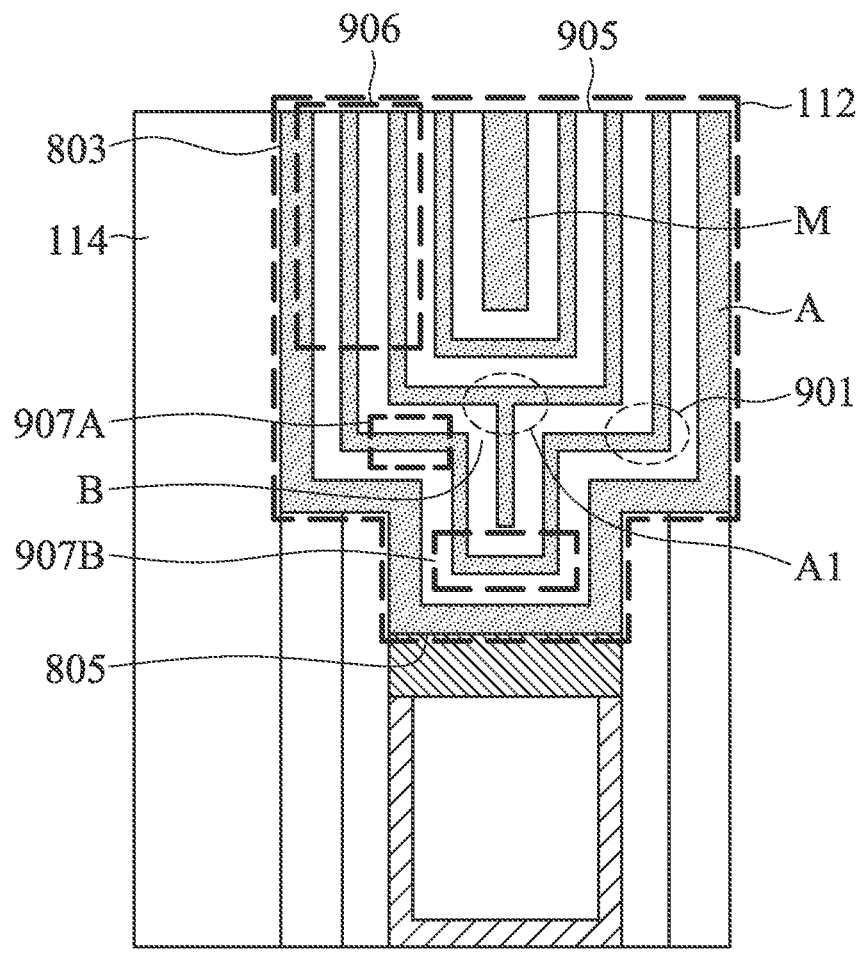

FIG. 9 shows an illustrative embodiment of SAC dielectric layer 112 that takes advantage of the multilayer low dielectric/high etch selectivity structure. SAC layer 112 may include multiple dielectric sublayers such as sublayers A and B, and a merge sublayer M. Sublayers A and B are deposited, for example, using ALD, and merge sublayer M is formed in the middle of SAC dielectric layer 112 as a last sublayer during the deposition process. In various embodiments, the deposited dielectric sublayers are conformal to a shape of SAC trench 801. For example, the deposited sublayers may be partially parallel to surface 803 of ILD layer 114 (for example, region 906), and partially parallel to surface 805, (for example, regions 907A and 907B). In various embodiments, the deposited sublayers may include regions (for example, region 906) that may be nonparallel to at least a portion of the top surface of the gate stack. In various embodiments, as shown in FIG. 9, SAC layer 112 may have variable dielectric constant values along gate parallel and/or gate perpendicular directions.

Deposited sublayers, shown in FIG. 9, may include corners (e.g., corner 901), and region A1, referred to as T region, that contains abrupt changes in direction of sublayers. Changes in direction of sublayers lead to anisotropic properties of effective dielectric constant of layer 112, that allow to control and reduce capacitance (e.g., parasitic gate to source/drain parasitic capacitance) affected by layer 112. In some embodiments, sublayer A may be formed from low-k material, and sublayer B may be formed from material that has a higher etch selectivity than etch selectivity of material forming sublayer A. In some embodiments, sublayer B may be formed from low-k material, and sublayer A may be formed from material that has a higher etch selectivity than etch selectivity of material forming sublayer B. SAC dielectric layer 112 may have a top planar surface 905 which may, for example, be planarized using chemical-mechanical planarization (CMP). Surface 905 may be substantially parallel to surface 805.

Figure 10:
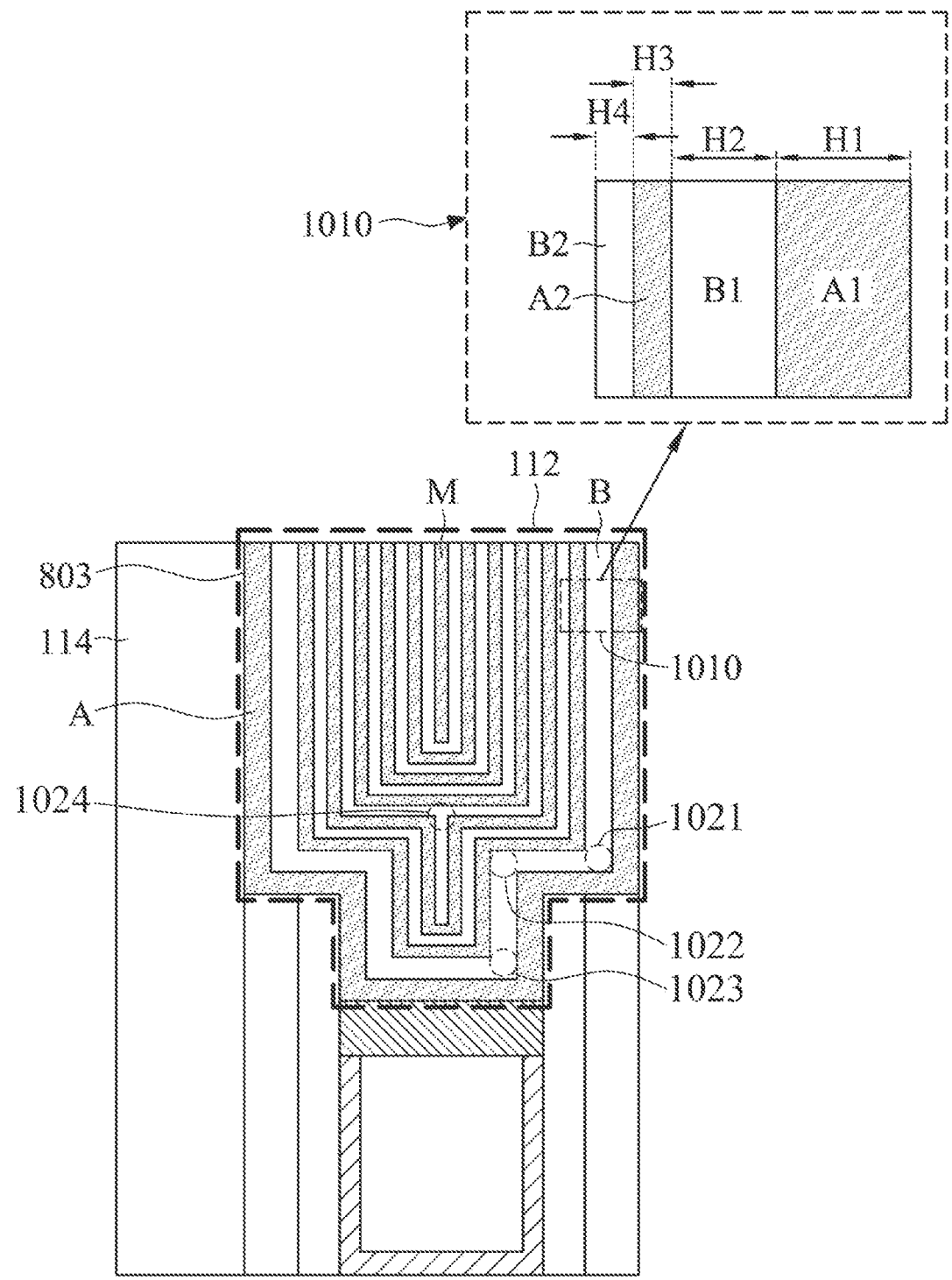
Figure 11:
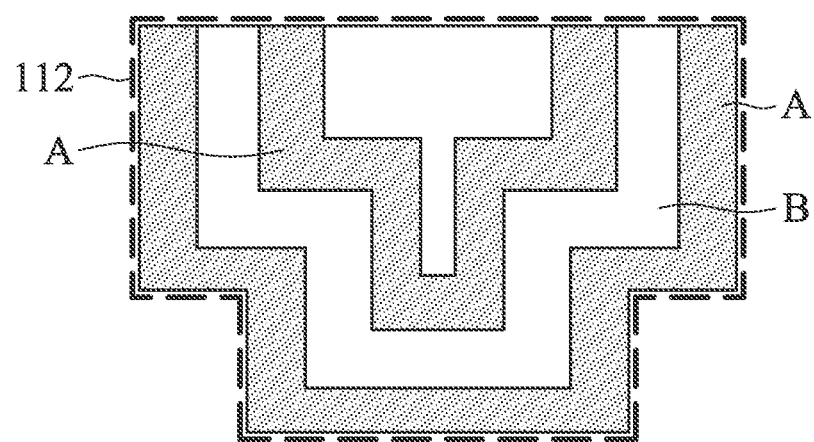

FIG. 9 show various embodiments of SAC dielectric layer 112 that may lead to reduced parasitic gate to source/drain capacitance, while maintaining overall high etch selectivity of layer 112. FIG. 9 shows, for example, SAC dielectric layer 112 including a merge sublayer M and four groups of sublayers, each group containing one sublayer A and one sublayer B. FIG. 10, shows, as an example, six groups of sublayers, with a merge sublayer M. In various embodiments, depending on the size and shape of SAC trench 801, SAC layer 112 may include one or more groups of sublayers with each group including at least two sublayers formed from different dielectric materials. In some embodiments, sublayer A or sublayer B may also correspond to a merge sublayer. For example, FIG. 11 shows sublayers A and B with sublayer B corresponding to a merge sublayer. By means of example and without limitation, SAC layer 112 may include one group of sublayers two group of sublayers, three group of sublayers, four group of sublayers, five group of sublayers, six group of sublayers, or more groups of sublayers. In some embodiments, SAC layer 112 may include a merge sublayer that may not be part of sublayers forming groups of sublayers, and in some embodiments, the merge sublayer may be part of sublayers forming groups of sublayers (e.g., merge sublayer B in FIG. 11).

In some embodiments, a group of sublayers shown in FIG. 10 may include sublayer A formed from low-k material followed by sublayer B formed from material that has a higher etch selectivity than etch selectivity of material forming sublayer A. Sublayer A may be the first sublayer deposited in SAC trench 801 followed by deposition of sublayer B. In an alternative embodiment, sublayer B may be deposited first in SAC trench 801 followed by sublayer A. In some embodiments, sublayer B may be adjacent to top conductive gate layer 116, and in some embodiments, sublayer A may be adjacent to top conductive gate layer 116. In some embodiments, sublayer B may be adjacent to ILD layer 114, and in some embodiments, sublayer A may be adjacent to ILD layer 114. In some embodiments, a merge sublayer (e.g., merge sublayer M in FIG. 10) may be formed from the same material as the material for sublayer A, and in some embodiments the merge sublayer may be formed from the same material as the material for sublayer B. In various embodiments, the merge sublayer may be formed from a different material than material used to form sublayers A and B.

In various embodiments, sublayers A and B may vary in thickness from one sublayer group to the other as shown in FIG. 10. For example, a first group of sublayers A and B deposited in SAC trench 801 may be thicker than a second group of sublayers. In some embodiments, sublayer A thickness may be larger than sublayer B thickness within the same group. For example, FIG. 10 shows region 1010 with sublayers A1, B1, A2 and B2 with respective thicknesses H1-H4. In an example embodiment, thickness H1 may be greater than H2, H3 or H4. In an example embodiment, thickness H1 may be greater than H2. In an example embodiment, thickness H2 may be larger than H4. Various illustrative embodiments include sublayers where the thickness of the sublayers may vary and may be selected to minimize overall dielectric constant of SAC layer 112 while maximizing etch selectivity of layer 112.

FIG. 10 shows that various sublayers may contain corners. For example, sublayer B may include corners 1021, 1022, and 1023. The corners may be the regions where a sublayer changes direction. The term "direction" in context of sublayers, refers to orientation of a normal vector to a surface of the sublayer. As shown in FIG. 10, sublayer B may change direction from being parallel to surface 803 of ILD layer 114 (the normal vector perpendicular to surface 803) to being perpendicular to surface 803 (the normal vector parallel to surface 803). In various embodiments, the orientation of the normal vector may take variety of values between values corresponding to direction perpendicular to surface 803 to values corresponding to direction parallel to surface 803. In addition to sublayers having corners, FIG. 10 illustrates that sublayers may have T regions (e.g., region 1024), similar to T region A1 shown in FIG. 9. In some embodiments, sublayer B may include a T region, and in some embodiments, sublayer A may include a T region.

Figure 12:
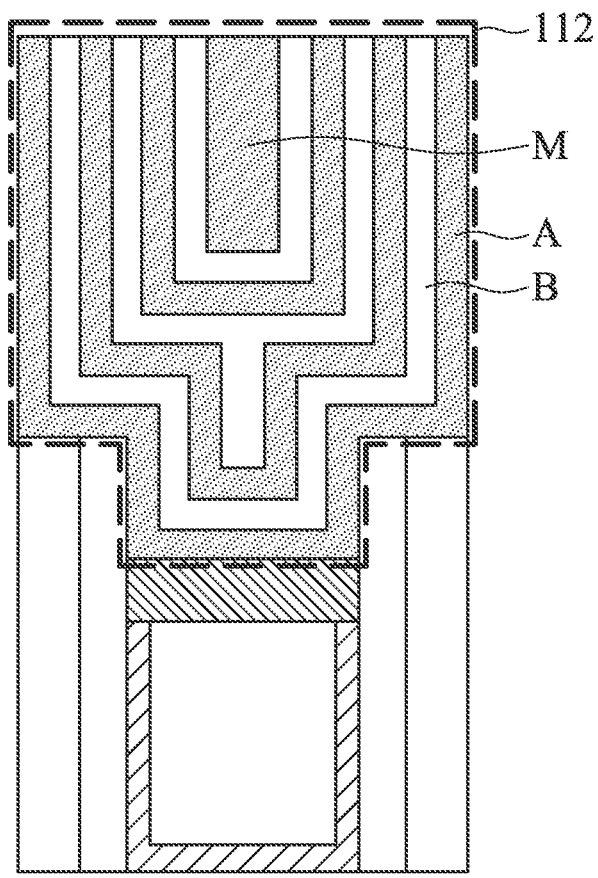
Figure 13:
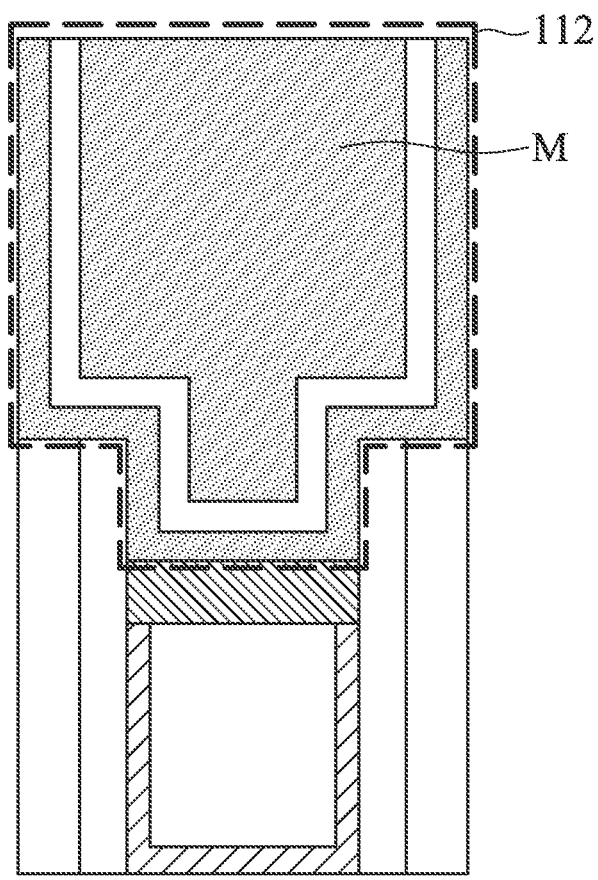

FIGS. 12 and 13 show an example embodiment of SAC dielectric layer 112 with a thick merge layer M. FIG. 12 shows that SAC layer 112 may have three groups of sublayers A and B and a merge layer. FIG. 13 shows that SAC layer 112 may have only one group of sublayers A and B and a merge layer. In some embodiments, the merge layer may be formed from a low-k material (e.g., silicon oxide, aluminum oxide, carbon doped silicon oxide, nitride doped silicon oxide, porous silicon oxide, porous aluminum oxide, and/or the like). In some embodiments, the merge layer may be formed from a high etch selectivity material (e.g., $HfO_2$, $ZrO_2$, and/or the like) to resist wet etch.

As explained above, SAC dielectric layer 112 may be fabricated as a laminate dielectric layer formed from sublayers, with at least some sublayers formed from low-k materials and at least some sublayers formed from high etch selectivity materials, in order to provide layer 112 with desired effective dielectric constant and etch selectivity. The capacitance of SAC layer 112 as the laminate dielectric layer, may be estimated based on parallel and series capacitance of sublayers. For example, the capacitance of SAC layer 112 containing sublayers parallel to conducting surfaces may be calculated using series capacitance formulation as $1/C_{ts}=\Sigma_i 1/C_{is}$, where $C_{ts}$—total series capacitance of SAC layer 112 when SAC layer 112 contains sublayers parallel to conducting surfaces, and $C_{is}$ is a capacitance of the individual sublayer that can be expresses as $C_{is}=k_i \in_o A/h_i$, where $k_i$—dielectric constant of the $i^{th}$ sublayer, $\in_0$—permittivity of space, A—lateral area of a sublayer, and $h_i$—thickness of the $i^{th}$ layer. A series dielectric constant $k_{ts}$ for SAC layer 112 may be obtained from $h_t/k_{ts}=\Sigma_i h_i/k_i$, where $h_t$—total thickness of SAC layer 112, $h_t=\Sigma_i h_i$. For SAC layer 112 containing layers perpendicular to conducting surfaces, capacitance may be calculated using parallel capacitance formulation as $C_{tp}=\Sigma_i C_{ip}$, where $C_{tp}$—total parallel capacitance of SAC layer 112, $C_{ip}$ is a capacitance of the individual sublayer, $C_{ip}=k_i \in_o h_i W/L$, where W—width of the layer, and L—length of the layer. The parallel dielectric constant for SAC layer 112 may be obtained from $k_{tp}=\Sigma k_i (h_i/h_t)$. The series capacitance is dominated by sublayers with smaller capacitance, while parallel capacitance is dominated by sublayers with larger capacitance.

Figure 14:
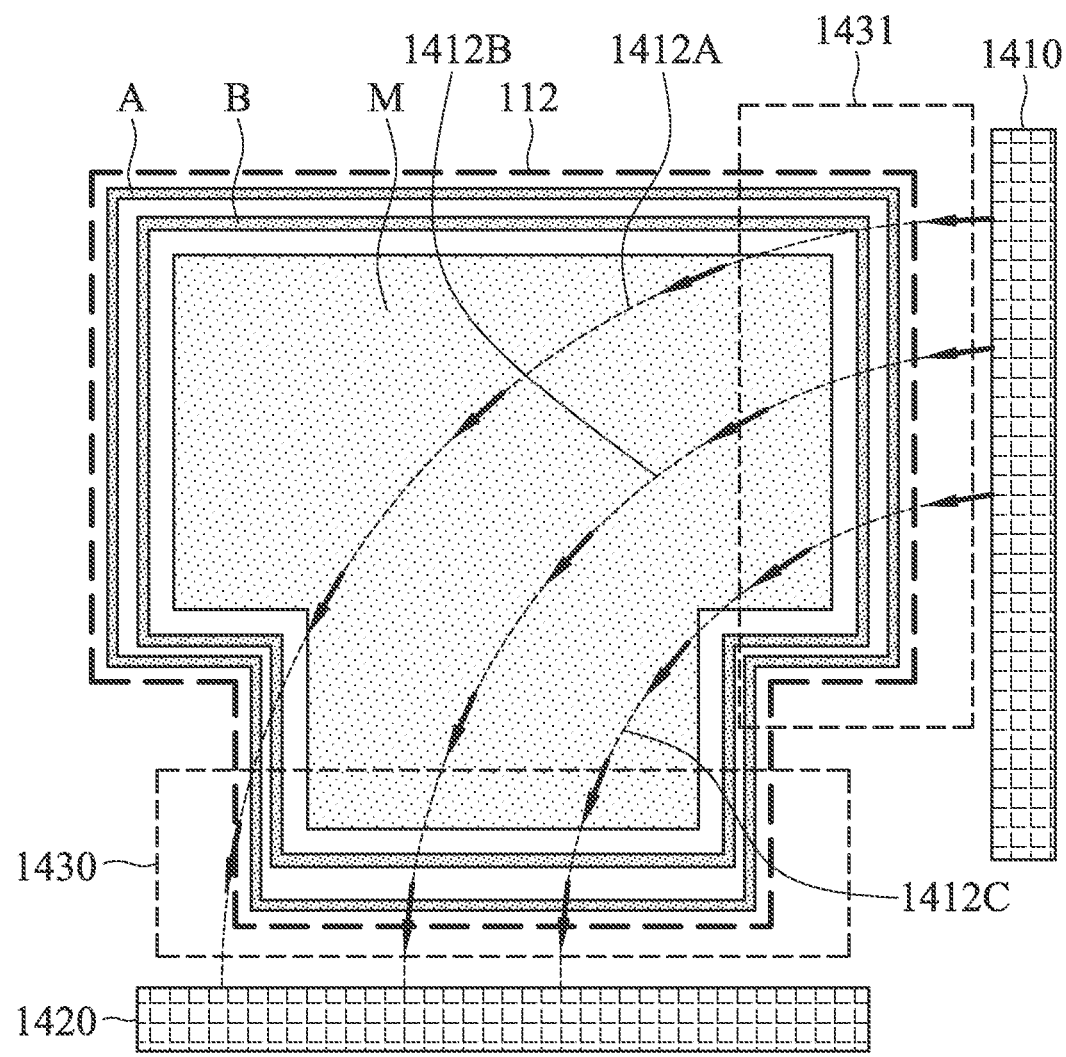
FIG. 14 is a cross-sectional view of a laminated dielectric layer, conductive regions, and electric field lines, consistent with various illustrative embodiments.

Depending on the position of conducting surfaces, SAC layer 112 may have regions of series capacitance and regions of parallel capacitance. FIG. 14 shows, for example, SAC layer 112, sublayers A, B, merge layer M and conducting regions 1410 and 1420. In various embodiments, region 1420 may be a metal gate and region 1410 may be a source/drain contact 102. Applying a potential difference between regions 1410 and 1420 results in electric field lines 1412A-1412C. Electric field lines 1412A-1412C are perpendicular to surfaces of conductive regions 1410 and 1420 (e.g., when conductive surfaces have low resistance), and in proximity to conductive surfaces, sublayers A and B are parallel to conductive surfaces, resulting in region 1430 and 1431 of SAC layer 112 having series capacitance. Within merge layer M, the electric field lines may follow an approximately circular path as shown in FIG. 14. The overall capacitance of SAC layer 112 may be approximated as a capacitance of merge layer M and series capacitance from sublayers located in proximity to conducting regions 1410 and 1420, with merge layer M capacitance being a dominating term in the overall capacitance of SAC layer 112. If merge layer M is formed from low-k material, the overall capacitance of SAC layer 112 may be minimized.

In an illustrative embodiment, depicted in FIG. 14, SAC layer 112 may include several groups of sublayers formed from various dielectric materials. Sublayers A may be formed from low-k materials, and sublayers B may be formed from materials that have an etch selectivity higher than the etch selectivity of materials forming sublayers A. In various embodiments, the groups of the sublayers may be conformal to surfaces of SAC trench 801 shown in FIG. 8A. SAC layer 112 may include merge layer M deposited after the deposition of the several groups of sublayers, with merge layer M formed from a low-k material and occupying a significant portion of SAC layer 112. For example, merge layer M may occupy between five to ninety nine percent of the volume of SAC layer 112. The presence of merge layer M formed from a low-k material occupying a significant portion of SAC layer 112 may reduce overall capacitance of layer 112 as compared to capacitance of layer 112 with merge layer M formed from a high-k material, or to capacitance of layer 112 with merge layer M occupying a smaller portion of layer 112. The presence of merge layer M surrounded by sublayers A and B with at least some sublayers (e.g., sublayer B) formed from materials with high etch selectivity, may result in overall high etch selectivity of layer 112 without significant trade-off in layer 112 capacitance as compared to the capacitance of an illustrative layer 112 without such sublayers.

Figure 15:
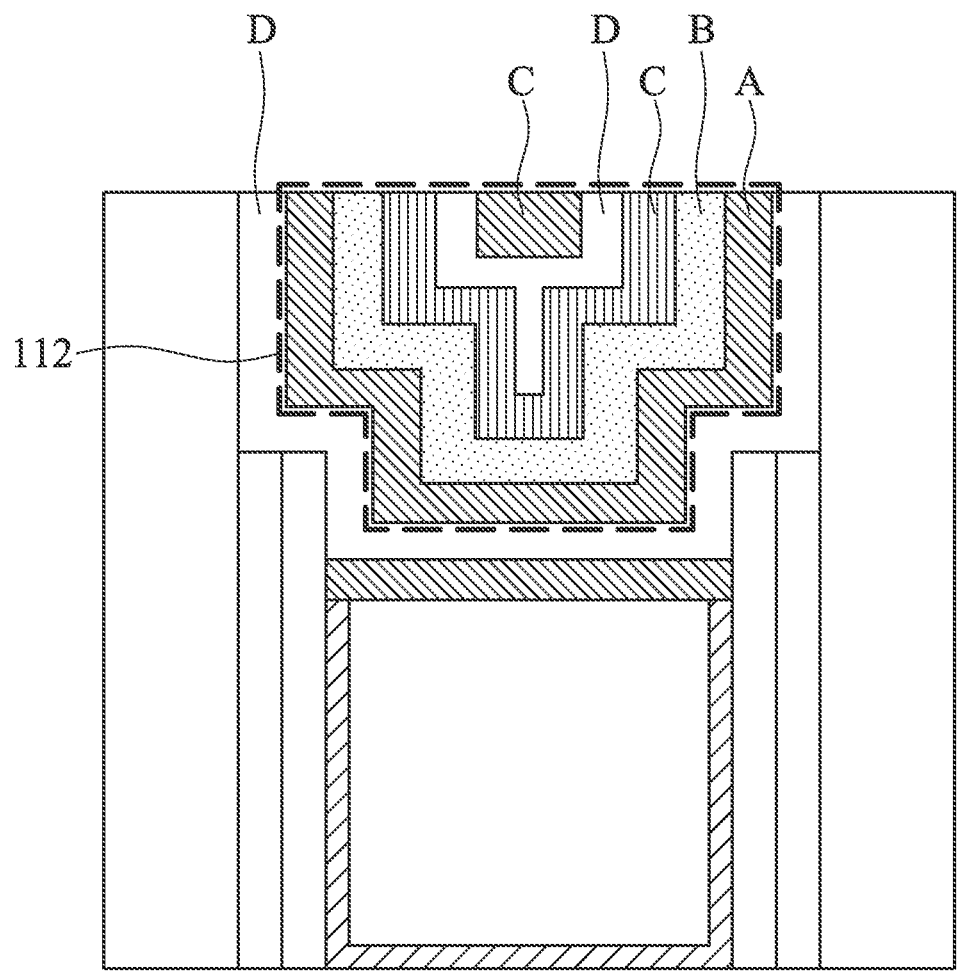
FIG. 15 is a cross-sectional view of a laminated dielectric layer, consistent with various illustrative embodiments.

FIG. 15 shows an example embodiment of SAC layer 112 containing sublayers formed from various materials. For example, SAC layer 112 may include sublayers A-D, as shown in FIG. 15, with each sublayer formed from a different material. As an example embodiment, sublayer A may be formed from zirconium oxide, sublayer B may be formed from aluminum oxide, sublayer C may be formed from hafnium oxide, and sublayer D may be formed from silicon oxide. The example embodiment of materials for various layers is only illustrative, and various other materials may be used. Furthermore, sublayers A-D may have different shapes and thicknesses consistent with various embodiments.

Figure 16A:
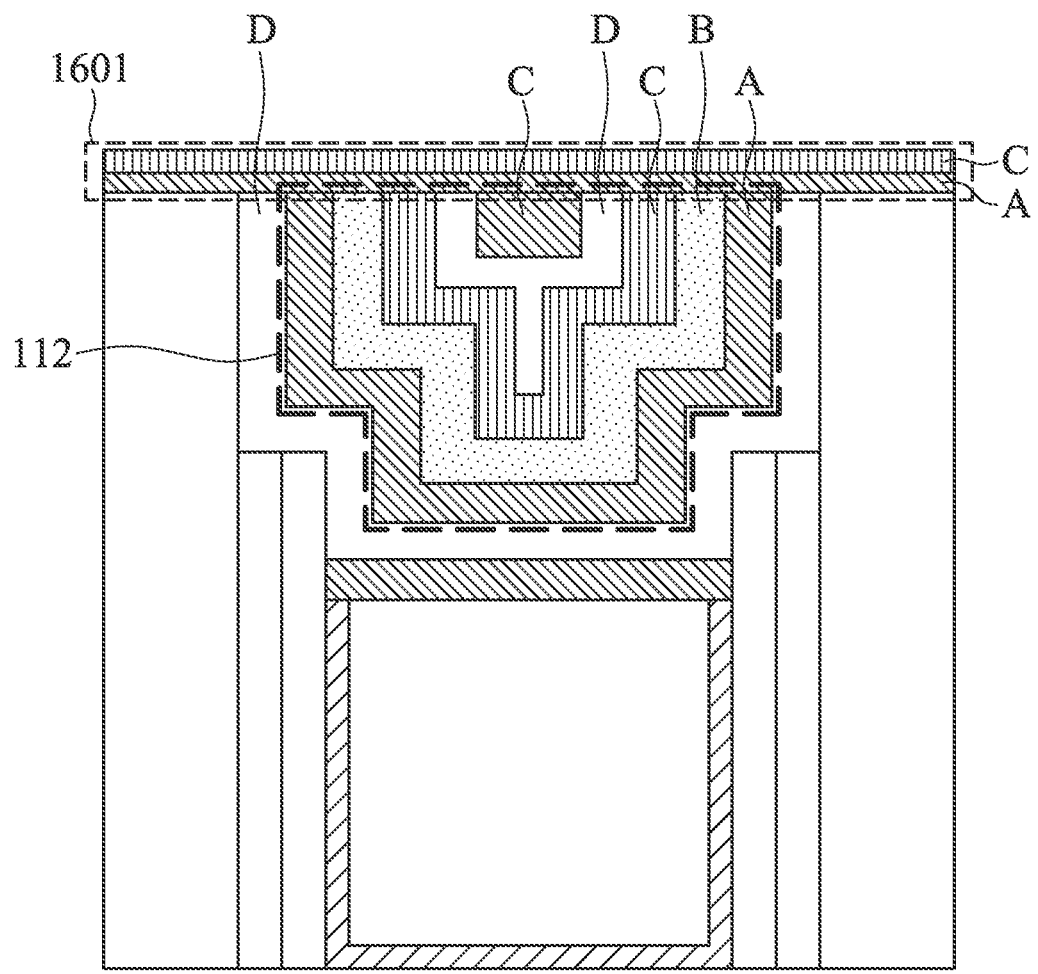
FIG. 16A is a cross-sectional view of a laminated dielectric layer with a cap layer, consistent with various illustrative embodiments.

FIG. 16A shows an illustrative embodiment, containing cap layer 1601. The cap layer may include etch protecting layers and may include one or more sublayers. For example, cap layer 1601 may include sublayer A and sublayer C both formed from high etch selectivity materials such as zirconium oxide and hafnium oxide. The example embodiment of materials forming cap layer 1601 is only illustrative, and other dielectric materials may be used. In various embodiments, the materials forming sublayers of cap layer 1601 may have higher etch selectivity when compared to etch selectivity of low-k materials forming some of the sublayers of SAC layer 112. In various embodiments, cap layer 1601 may protect SAC layer 112 from being etched during a fabrication of a device.

Figure 16B:
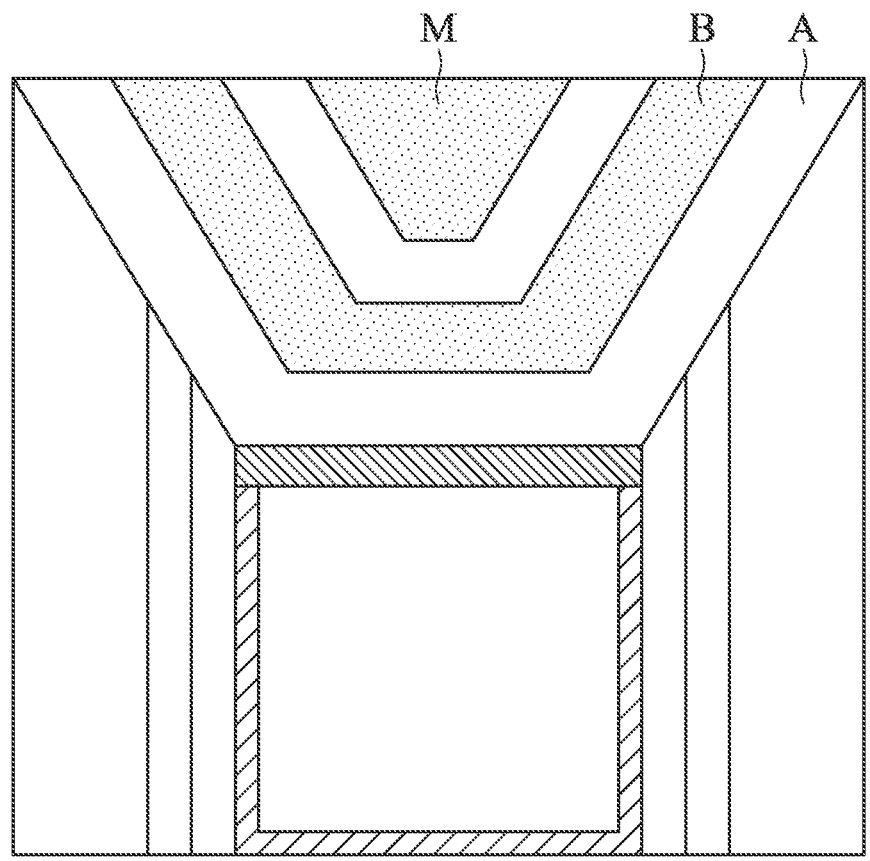
FIG. 16B is a cross-sectional view of a laminated dielectric layer, consistent with various illustrative embodiments.
Figure 16C:
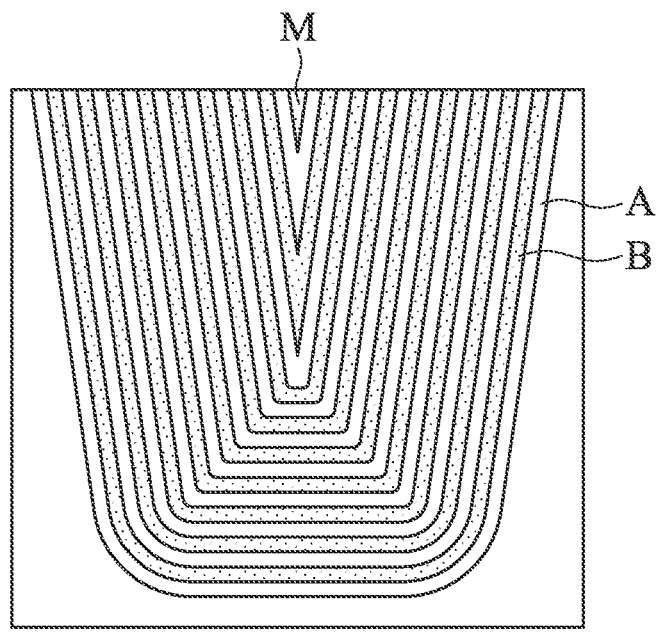
FIG. 16C is a cross-sectional view of a laminated dielectric layer, consistent with various illustrative embodiments.

In various embodiments, the SAC trench 801 (e.g., trench shown in FIG. 8B or FIG. 8C) may have a square shape or trapezoidal shape. For example, FIG. 16B shows example of SAC layer 112 deposited in SAC trench 801 forming a trapezoidal shape. SAC layer 112 may include sublayers A, B and a merge layer M. FIG. 16C shows a TEM image of a corresponding SAC layer 112, with corresponding sublayers A, B and merge layer M. Trapezoidal or square shapes of SAC trench 801 may be beneficial from a standpoint of fabrication of SAC trench 801. For example, fabrication of square or trapezoidal trench may include less processing steps, a simpler etch recipe or the like. It should be noted that square or trapezoidal shapes of SAC trench 801 is only illustrative, and other shapes of SAC trench 801 may be used.

Figure 17:
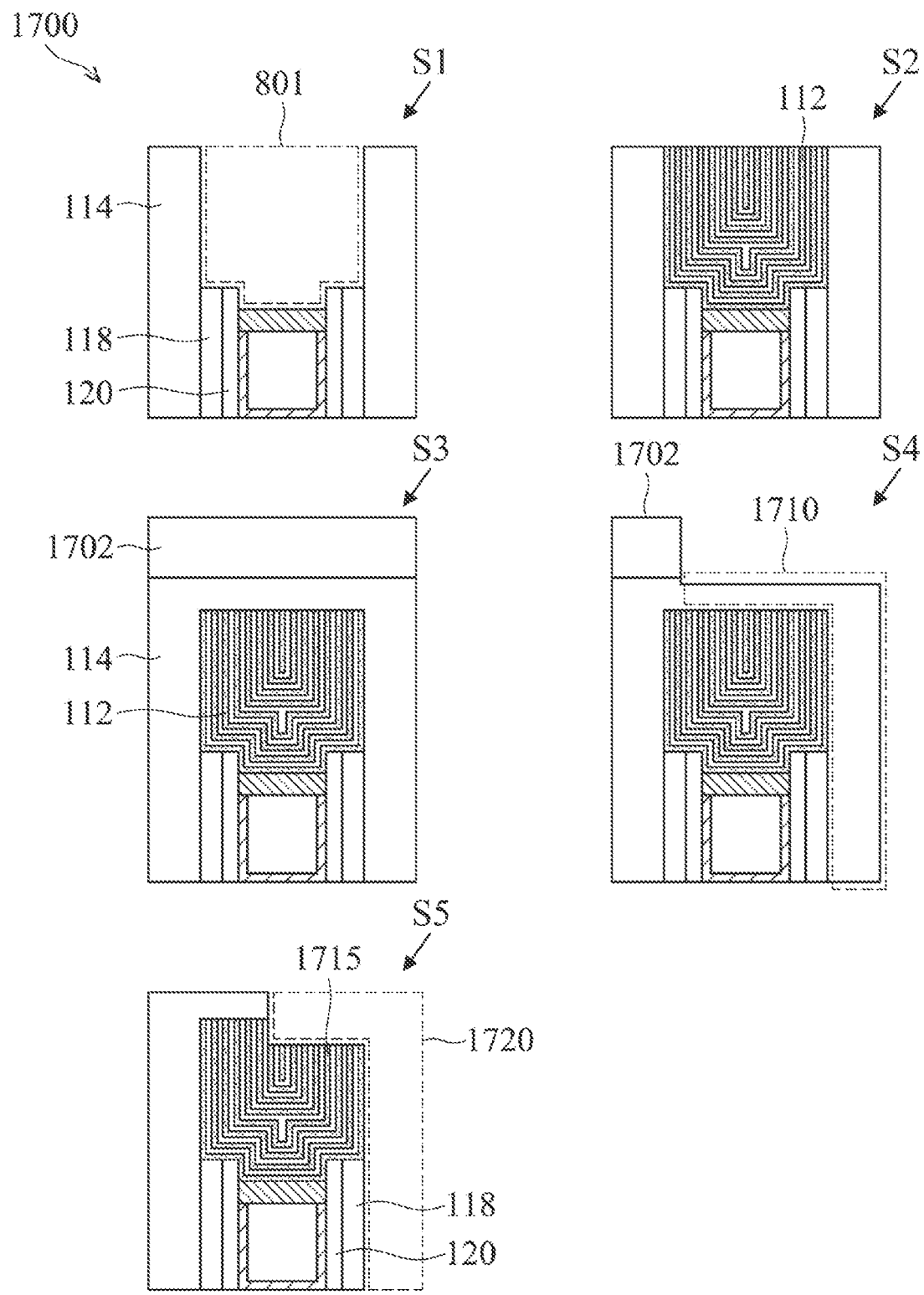
FIG. 17 is a diagram of an illustrative process of etching a trench in proximity of a laminated dielectric layer, consistent with various illustrative embodiments.

In various embodiments, SAC layer 112 may be used to protect the layers of gate stack 117 during a process of etching ILD layer 114 to form a trench. A trench 1720, for example, may be formed using an illustrative process 1700 shown in FIG. 17. In step 1 (S1) of process 1700, SAC trench 801 (as shown also in FIGS. 8A-8C) may be formed by etching back spacers 118, spacer 120, and metal gate (MG) with dry or wet etching with selectivity to ILD 114. In some embodiments, SAC trench 801 may be formed through etching back spacers 118, spacer 120, and metal gate (MG) and then selectively deposit an etch stopping layer on metal gate. In step 2 (S2), laminated SAC layer 112 containing multiple sublayers may be deposited in SAC trench 801 by ALD (as shown also in FIGS. 9-13). In step 3 (S3), the ILD layer 114 may be deposited over SAC layer 112 followed by deposition of a hard mask 1702 that may be formed from various materials such as silicon nitride, silicon carbide, silicon boron carbide, silicon boron nitride and/or the like. In step 4 (S4), a portion of the hard mask 1702 may be etched using, for example, plasma etching (e.g., using $CF_4$ gas) resulting in exposed portion 1710 of ILD layer 114. In step 5 (S5), an exposed portion 1710 of ILD layer 114 may be etched using an oxide etch, resulting in removal of exposed portion 1710 and partial removal of SAC layer 112, thus, resulting in SAC structure 1715 with trench 1720. Depending on etch selectivity of SAC layer 112, a small or a large portion of SAC layer 112 may be removed. In some cases, five percent of SAC layer 112 may be removed, ten percent of SAC layer 112 may be removed, or when SAC layer 112 has lower etch selectivity, fifty percent of SAC layer 112 may be removed. In some embodiments, exposed portion 1710 may be removed using the dry or wet etch with high selectivity to the material of spacers 118 and 120 in order to remove exposed portion 1710 and retain spacers 118 and 120 in some instances.

Figure 18:
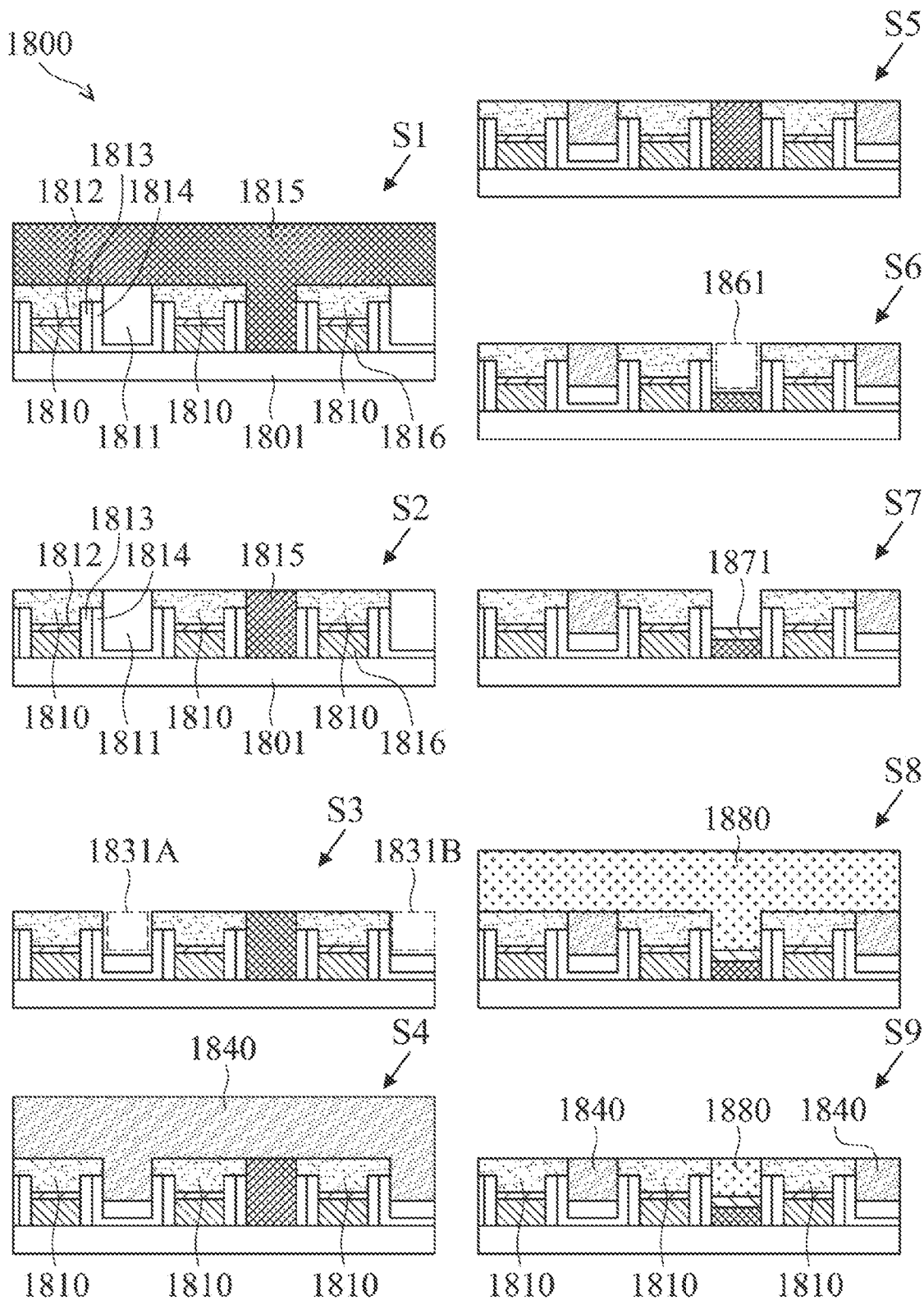
FIG. 18 is a diagram of an illustrative process of forming a semiconductor structure with multiple self-aligned contact (SAC) layers, consistent with various illustrative embodiments.

FIG. 18 shows an illustrative process 1800 for manufacturing a semiconductor structure with multiple SAC layers and contact structures. Some or all of the SAC layers of the semiconductor structure may include laminated structures and be formed from multiple dielectric sublayers. In step 1 (S1) of process 1800, a semiconductor structure may include substrate 1801, multiple metal conductive gate layers 1816, spacer 1813, contact etch stopping layer 1814, etch stopping layer 1812, SAC layer 1810, ILD layer 1811, and a metal layer 1815. Layers and structures of FIG. 18 may correspond to layers and structures of FIG. 1A. For example, substrate 1801 may correspond to substrate 122, metal conductive gate layer 1816 may correspond to conductive gate region 108, spacer 1813 may correspond to spacer 120 and contact etch stopping layer 1814 may correspond to spacer 118. Etch stopping layer 1812 may be an additional layer not shown in FIG. 1A, SAC layer 1810 may correspond to SAC layer 112, and ILD layer 1811, may correspond to layer 114. In step 2 (S2) of process 1800, a portion of metal layer is removed to form metal layer 1815 (e.g., using CMP), and in step 3 (S3), a portion of ILD layer 1811 is removed (e.g., using etching process), forming trenches 1831A and 1831B. In step 4 (S4), SAC layer 1840 is deposited in trenches 1831A and 1831B and over SAC layers 1810 using, for example, ALD. In step 5 (S5), portion of SAC layer 1840 may be removed (e.g., using CMP), and in step 6 (S6) a portion of metal contact may be etched (e.g., using plasma etch) resulting in trench 1861. In step 7 (S7), an etch stopping layer 1871 may be deposited in the trench 1861 (e.g., using photolithography and ALD) and in step 8 (S8), SAC layer 1880 may be deposited over SAC layer 1840, SAC layer 1810, and etch stopping layer 1871. Etch stopping layer 1871 may be formed, for example, from a silicon nitride. In various embodiments, SAC layer 1840 may have the same laminated dielectric structure as SAC layer 112, and in other cases, SAC layer 1840 may be a single dielectric layer (e.g., silicon oxide, aluminum oxide, zirconium oxide, and the like).

In step 9 (S9), portion of SAC layer 1880 may be removed (e.g., using CMP) resulting in a structure that includes SAC layer 1810, SAC layer 1840 and SAC layer 1880. In various embodiments of the process 1800, at least one of the depositions of SAC layer 1810, SAC layer 1840 and SAC layer 1880 includes deposition of multiple dielectric sublayers. In various embodiments, SAC layer 1880 may have the same laminated dielectric structure as SAC layer 112, and in other cases, SAC layer 1880 may be a single dielectric layer (e.g., silicon oxide, aluminum oxide, zirconium oxide, and the like).

Figure 19A:
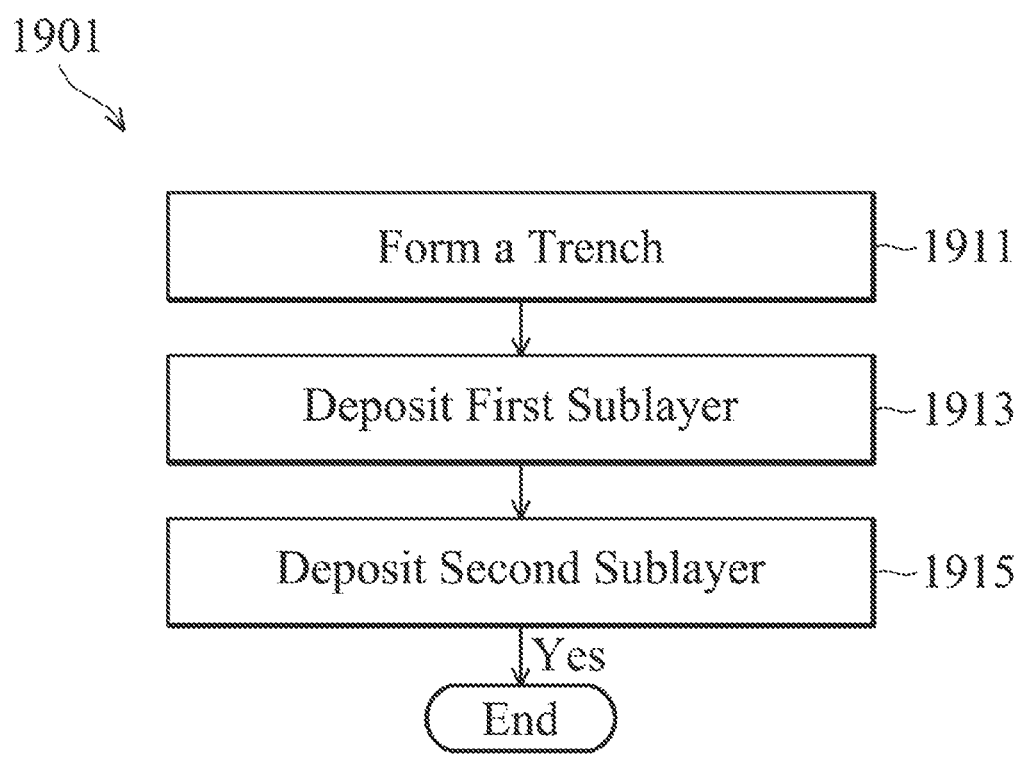
FIGS. 19A and 19B are flowcharts of respective illustrative processes of forming a SAC layer consistent with various illustrative embodiments.
Figure 19B:
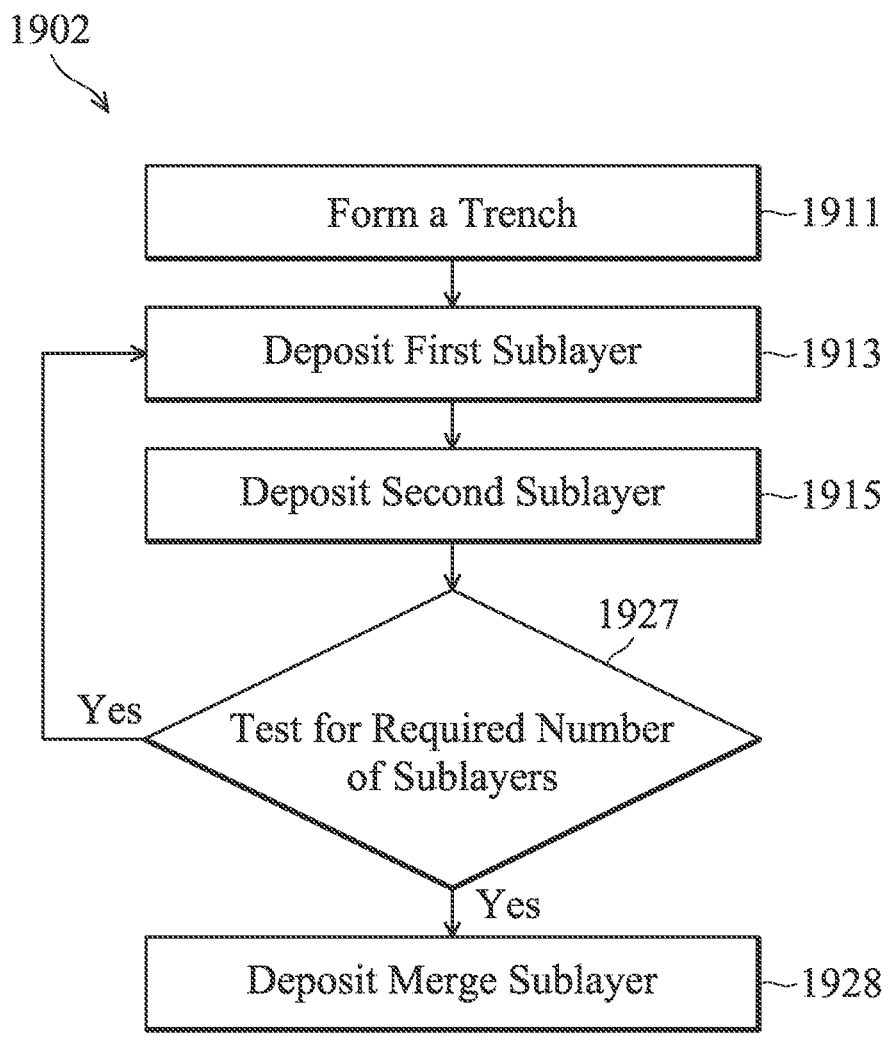

FIGS. 19A and 19B show illustrative processes 1901 and 1902 for forming SAC laminated dielectric layer 112. In step 1911 of process 1901, SAC trench 801 may be formed within ILD layer 114 via single or multiple materials etching back. At step 1913 of process 1901, a first sublayer formed from the first material may be deposited. In step 1915 of process 1901, a second sublayer may be deposited from the second material. In various embodiments, the first material may include a low-k material such as silicon oxide, aluminum oxide, carbon doped silicon oxide and/or the like. The second material may have high-etch selectivity and may include zirconium oxide, hafnium oxide, titanium oxide, and/or the like. The first low-k material may have a dielectric constant lower than a dielectric constant of the second material, and the second material may have an etch selectivity higher than an etch selectivity of the first material. In an alternative illustrative embodiment of the process 1901, step 1913 may include depositing a first sublayer formed from the second material, and step 1915 may include depositing a second sublayer formed from the first material.

FIG. 19B shows a process 1902, which is a variation of process 1901 of FIG. 19A. Step 1911 of process 1902 may be the same as step 1911 of process 1901 and may include formation of SAC trench 801 via etching. Step 1913 of process 1902 may be the same as step 1913 of process 1901, and step 1915 of process 1902 may be the same as step 1915 of process 1901. Step 1927 of process 1902, may test if a required number of sublayers have been deposited. In an example embodiment, a test may be performed by a processor that may execute programing instructions for counting deposited sublayers and for verifying if a required number of deposited sublayers have been reached. If more sublayers need to be deposited (1927, YES), step 1913 of process 1902 may be repeated. If no more sublayers need to be deposited (1927, NO), step 1928 may be executed. In step 1928 of process 1902, a merge sublayer may be deposited. In some embodiments, the material for the merge sublayer may include a low-k material such as silicon oxide, aluminum oxide, carbon doped silicon oxide and/or the like. In some embodiments, a material of the merge sublayer may have a dielectric constant that is lower than the dielectric constant of the first or the second sublayer deposited during process 1902. In some embodiments, the material for the merge sublayer may be formed from a high etch selectivity material to resist wet etch. In some embodiments, a thickness of the merge sublayer may be larger than the thickness of the first or the second sublayer.

Figure 20:
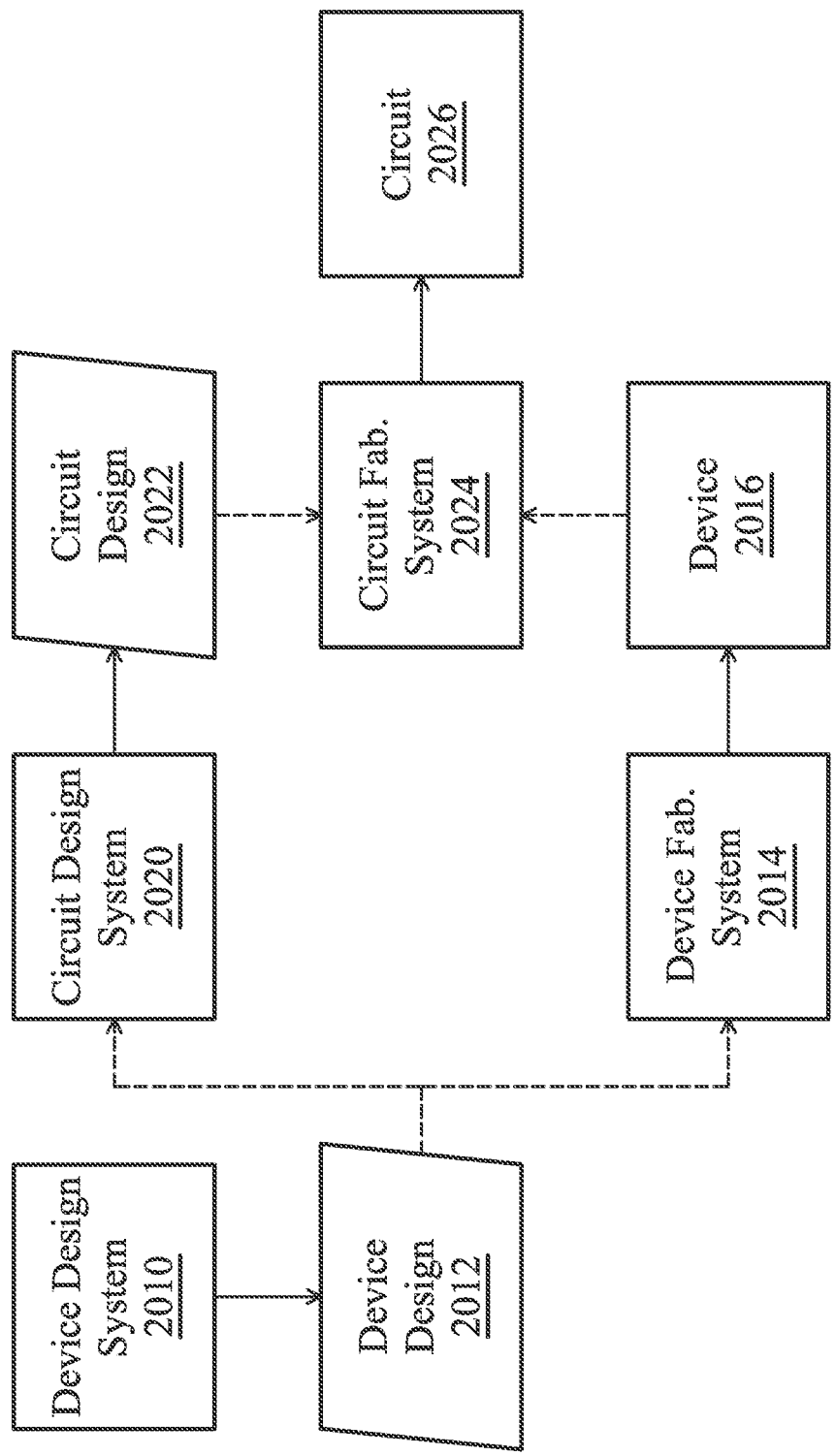
FIG. 20 is an illustrative flow diagram for fabricating a circuit consistent with various illustrative embodiments.

The disclosed embodiments provide a method of designing and/or fabricating a circuit that includes one or more of the devices designed and fabricated as described herein (e.g., including one or more devices fabricated to include a semiconductor structure described herein). For example, FIG. 20 shows an illustrative flow diagram for fabricating a circuit 2026. Initially, a user can utilize a device design system 2010 to generate a device design 2012 for a semiconductor device containing semiconductor structure 100 as described herein. The device design 2012 can comprise program code, which can be used by a device fabrication system 2014 to generate a set of physical devices 2016 containing semiconductor structure 100 according to the features defined by the device design 2012. Similarly, the device design 2012 can be provided to a circuit design system 2020 (e.g., as an available component for use in circuits), which a user can utilize to generate a circuit design 2022 (e.g., by connecting one or more inputs and outputs to various devices included in a circuit). The circuit design 2022 can comprise program code that includes a device designed as described herein. In any event, the circuit design 2022 and/or one or more physical devices 2016 can be provided to a circuit fabrication system 2024, which can generate a physical circuit 2026 according to the circuit design 2022. The physical circuit 2026 can include one or more devices 2016 containing semiconductor structure 100 designed as described herein.

In some cases, the disclosed embodiments may include a device design system 2010 for designing and/or a device fabrication system 2014 for fabricating a semiconductor device 2016 containing semiconductor structure 100 as described herein. In this case, the systems 2010, 2014 can include a computing device, which is programmed to implement a method of designing and/or fabricating the semiconductor device 2016 containing semiconductor structure 100 as described herein. Similarly, an embodiment provides a circuit design system 2020 for designing and/or a circuit fabrication system 2024 for fabricating a circuit 2026 that includes at least one device 2016 containing semiconductor structure 100 designed and/or fabricated as described herein. In this case, the system 2020, 2024 can comprise a computing device, which is specifically programmed to implement the described method of designing and/or fabricating the circuit 2026 including at least one semiconductor device 1016 containing semiconductor structure 100 as described herein.

Some illustrative embodiments may include a computer program fixed in at least one computer-readable medium, which when executed, enables a computer system to implement a method of designing and/or fabricating a semiconductor device containing semiconductor structure 100 as described herein. For example, the computer program can enable the device design system 2010 to generate the device design 2012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In some cases, the disclosed embodiments may include a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In some cases, the disclosed embodiments may include a method of generating a device design system 2010 for designing and/or a device fabrication system 2014 for fabricating a semiconductor device containing semiconductor structure 100 as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

Unless described otherwise or in addition to that described herein, "etching" may include any now known or later developed techniques appropriate for removal of material, including, but not limited to dry etching processes (e.g., plasma etching, plasma-less gas etching, sputter etching, ion milling, reactive ion etching (RIE)) or wet etching processes (e.g., applying an acid, base, or solvent to dissolve part of the structure, or an abrasive formulation to polish away part of the structure).

In various embodiments, semiconductor structure 100 may contain one or more SAC layers, such as, for example, SAC layers 1810, 1840 and 1880 shown in FIG. 18, or SAC layer 112 depicted in FIG. 12. In various embodiments, it may be desired to fabricate SAC layers with low effective dielectric constant and high etch selectivity. For example, low effective dielectric constant of a SAC layer may reduce gate to source/drain parasitic capacitance of a transistor, fabricated using such SAC layer, while high etch selectivity of an SAC layer may preserve the SAC layer during device fabrication. To achieve such SAC layers, SAC layers may include sublayers formed from different dielectric materials. Some sublayers forming SAC layers may be formed from low-k material such as silicon oxide, aluminum oxide, carbon doped silicon oxide and/or the like, and some sublayers forming SAC layers may be formed from material with high-etch selectivity such as zirconium oxide, hafnium oxide, titanium oxide, and/or the like. In various embodiments, forming SAC layers from low-k material sublayers alternating with high-etch selectivity sublayers may result in low effective dielectric constant and high etch selectivity for SAC layers. The sublayers may be deposited using ALD and may be on the order of three or more nanometers thick. In some embodiments, the sublayers may be less than three nanometers thick. In various embodiments, a SAC layer (e.g., SAC layer 112 shown in FIG. 13) may include a middle region that is referred to as a merge sublayer (merge sublayer M in FIG. 13). The merge sublayer may be formed from low-k material or high etch selectivity material and may be thicker than other sublayers. In some embodiments, the merge sublayer may include a region that forms a substantial part of a SAC layer.

Consistent with a disclosed embodiment, a structure including a semiconductor substrate, a gate stack deposited over a first portion of a top surface of the semiconductor substrate and a laminated dielectric layer is provided. The laminated dielectric layer is deposited over at least a portion of a top surface of the gate stack and includes at least a first sublayer and a second sublayer. The first sublayer is formed of a material having an etch selectivity lower than an etch selectivity of the material used to form the second sublayer. The material used to form the second sublayer has a dielectric constant higher than a dielectric constant of a material used to form the first sublayer.

Consistent with another disclosed embodiment, a structure including a semiconductor substrate, a gate stack deposited over a first portion of a top surface of the semiconductor substrate, an interlayer dielectric layer and a laminated dielectric layer is provided. The interlayer dielectric layer is deposited over a second portion of the top surface of the semiconductor substrate. The interlayer dielectric layer has at least one surface that is nonparallel to the top surface of the semiconductor substrate. The laminated dielectric layer is deposited over at least a portion of a top surface of the gate stack and includes at least a first sublayer and a second sublayer. The first sublayer is formed of a material having an etch selectivity lower than an etch selectivity of the material used to form the second sublayer. The material used to form the second sublayer has a dielectric constant higher than a dielectric constant of a material used to form the first sublayer. The laminated dielectric layer extends in a gate parallel and a gate perpendicular direction.

Consistent with another disclosed embodiment, a method of forming a laminate dielectric layer within a trench region having a trench surface is disclosed. The method includes one or more groups of steps, where the steps include depositing a first sublayer formed from a first material conformal to the trench surface, and depositing a second sublayer formed from a second material conformal to the trench surface. Either the first or the second material, is a low-k material, having a dielectric constant lower than a dielectric constant of another the first or the second material. Further, the low-k material has an etch selectivity lower than an etch selectivity of another the first or the second material.

The accompanying figures and this description depict and describe various embodiments and features and components thereof. Those skilled in the art will appreciate that any particular nomenclature used in this description was merely for convenience, and thus various embodiments should not be limited by the specific process identified and/or implied by such nomenclature. Therefore, it is desired that the embodiments described herein be considered in all respects as illustrative, not restrictive, and that reference be made to the appended claims for determining the scope of various embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a laminate dielectric layer within a trench region having a trench surface, the method comprising:
    forming a first layer located over a semiconductor substrate;
    forming a metallic contact layer located over the first layer and an etch stop layer located over the metallic contact layer;
    forming a second layer comprising a laminated dielectric structure located over the etch stop layer, wherein the laminated dielectric structure is formed by:
    depositing a first sublayer formed from a first material, the first sublayer being conformal to the trench surface; and
    depositing a second sublayer formed from a second material, the second sublayer being conformal to the trench surface;
    wherein the first material is a low-k material, having a dielectric constant and an etch selectivity lower than a dielectric constant and an etch selectivity of the second material.

2. The method of claim 1, further comprising a step of forming a merged sublayer, wherein the merged sublayer is formed of a material having a dielectric constant lower than the dielectric constant of the low-k material, and wherein a thickness of the merge sublayer is greater than a thickness of any other sublayer of the laminate dielectric layer.

3. The method of claim 1, wherein the material forming the second sublayer has an etch selectivity that is at least twice as high as an etch selectivity of the material forming the first sublayer.

4. A structure comprising:
a first layer located over a semiconductor substrate;
a metallic contact layer located over the first layer;
an etch stop layer located over the metallic contact layer; and
a second layer comprising a laminated dielectric structure having at least a first sublayer and a second sublayer, wherein the first sublayer is formed of a material having a dielectric constant lower than a dielectric constant of a material used to form the second sublayer and wherein the material used to form the second sublayer has an etch selectivity higher than an etch selectivity of the material used to form the first sublayer, wherein the laminated dielectric structure is located over the etch stop layer.

5. The structure of claim 4, further comprising:
a gate stack over a first portion of a top surface of the semiconductor substrate; and
an interlayer dielectric layer over a second portion of the top surface of the semiconductor substrate;
wherein the second layer is located over at least a portion of a top surface of the gate stack.

6. The structure of claim 4, wherein the second layer includes a plurality of alternating first and the second sublayers, the first sublayer being adjacent to the second sublayer.

7. The structure of claim 4, wherein a thickness of the first sublayer and the second sublayer is substantially between 0.1 nm and 10 nm.

8. The structure of claim 4, wherein a ratio of a thickness of the first sublayer to a thickness of the second sublayer is substantially between 0.1 and 10.

9. The structure of claim 4, wherein the second layer further comprises a third sublayer formed of a dielectric material having a dielectric constant lower than the dielectric constant of the material forming the second sublayer.

10. The structure of claim 4, wherein the second sublayer is formed from zirconium oxide, hafnium oxide, $La_2O_3$, $HfSiO_4$, $Y_2O_3$, $LaAlO_3$, $TaO_2$, or $Ta_2O_5$, and the first sublayer is formed from aluminum oxide, silicon oxide, silicon nitride, SiCN, SiOC, or SiOCN.

11. A structure comprising:
at least one gate stack over a first portion of a top surface of a semiconductor substrate;
at least one interlayer dielectric layer over a second portion of the top surface of the semiconductor substrate, the at least one interlayer dielectric layer having at least one surface that is nonparallel to the top surface of the semiconductor substrate;
at least one laminated dielectric layer over at least a portion of a top surface of the at least one gate stack and over an etch stop layer, the at least one laminated dielectric layer including at least a first sublayer and a second sublayer, wherein the first sublayer is formed from zirconium oxide, hafnium oxide, $LA_2O_3$, $HfSiO_4$, $Y_2O_3$, $LaAlO_3$, $TaO_2$, or $Ta_2O_5$, and the second sublayer is formed from aluminum oxide, silicon oxide, silicon nitride, SiCN, SiOC, or SiOCN; and
a metallic contact layer, wherein the etch stop layer is located over the metallic contact layer.

12. The structure of claim 11, wherein the first sublayer or the second sublayer includes a T-shaped region containing a change in a direction of the first sublayer or the second sublayer.

13. The structure of claim 11, wherein the at least one gate stack includes a first gate stack and a second gate stack, and the at least one laminated dielectric layer includes a first laminated dielectric layer located over the first gate stack and a second laminated dielectric layer located over the second gate stack.

14. The structure of claim 13, wherein the at least one laminated dielectric layer comprises a self aligned contact (SAC) dielectric layer.

15. The structure of claim 14, wherein the self aligned contact (SAC) dielectric layer is deposited in a trench formed between the first gate stack and the second gate stack.

16. The structure of claim 14, wherein the self aligned contact (SAC) dielectric layer is located over the etch stop layer.

17. The structure of claim 13, wherein the metallic contact layer is located between the first gate stack and the second gate stack.

18. The structure of claim 11, wherein a portion of the at least one laminated dielectric layer is adjacent to at least a portion of the at least one surface of the at least one interlayer dielectric layer that is nonparallel to the top surface of the semiconductor substrate.

19. The structure of claim 11, wherein the at least one laminated dielectric layer comprises a plurality of first sublayers and a plurality of second sublayers arranged alternating with one another.

20. The structure of claim 19, wherein the at least one laminated dielectric layer has at least one region comprising variable dielectric constant along a gate parallel direction or a gate perpendicular direction.

* * * * *